(12) United States Patent
Paek et al.

(10) Patent No.: US 10,665,648 B2
(45) Date of Patent: May 26, 2020

(54) ELECTROLUMINESCENSE DISPLAY DEVICE

(71) Applicant: LG Display Co., Ltd., Seoul (KR)

(72) Inventors: SeungHan Paek, Paju-si (KR); Hyunil Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/219,127

(22) Filed: Dec. 13, 2018

(65) Prior Publication Data

US 2019/0206955 A1 Jul. 4, 2019

(30) Foreign Application Priority Data

Dec. 29, 2017 (KR) .................. 10-2017-0184076

(51) Int. Cl.
| | | |
|---|---|---|
| *H01L 27/32* | (2006.01) | |
| *G09G 3/3225* | (2016.01) | |
| *H01L 27/12* | (2006.01) | |
| *H01L 29/786* | (2006.01) | |

(52) U.S. Cl.
CPC ....... *H01L 27/3246* (2013.01); *G09G 3/3225* (2013.01); *H01L 27/1225* (2013.01); *H01L 27/1255* (2013.01); *H01L 27/326* (2013.01); *H01L 27/3218* (2013.01); *H01L 27/3223* (2013.01); *H01L 27/3248* (2013.01); *H01L 27/3276* (2013.01); *H01L 29/78633* (2013.01)

(58) Field of Classification Search
CPC ............. H01L 27/3246; H01L 27/3218; H01L 29/78633; H01L 27/326; H01L 27/1255; H01L 27/1225; H01L 27/3223; H01L 27/3248; H01L 27/3276; G09G 3/3225
See application file for complete search history.

(56) References Cited

U.S. PATENT DOCUMENTS

| | | | |
|---|---|---|---|
| 10,002,910 B2 | 6/2018 | Oh et al. | |
| 2003/0127657 A1* | 7/2003 | Park | .................... H01L 27/3246 |
| | | | 257/79 |
| 2003/0146693 A1 | 8/2003 | Ishihara et al. | |
| 2005/0044805 A1 | 3/2005 | Comerford | |
| 2008/0121901 A1 | 5/2008 | Kim et al. | |

(Continued)

FOREIGN PATENT DOCUMENTS

| | | |
|---|---|---|
| CN | 107248391 A | 10/2017 |
| EP | 1 331 667 A2 | 7/2003 |

(Continued)

*Primary Examiner* — Selim U Ahmed
(74) *Attorney, Agent, or Firm* — Morgan, Lewis & Bockius LLP

(57) ABSTRACT

An electroluminescent display device includes a substrate, a circuit device layer provided on the substrate and having a first contact hole, a first electrode provided on the circuit device layer, a bank provided on the first electrode and configured to define a first emission area comprising a first sub emission area for exposing a first portion of the first electrode, and a second sub emission area for exposing a second portion of the first electrode, a first sub emission layer provided in the first sub emission area, and a second sub emission layer provided in the second sub emission area, wherein an area between the first sub emission area and the second sub emission area is overlapped with the first contact hole of the circuit device layer.

20 Claims, 10 Drawing Sheets

(56) References Cited

U.S. PATENT DOCUMENTS

| | | |
|---|---|---|
| 2009/0315814 A1 | 12/2009 | Tomida et al. |
| 2012/0001186 A1 | 1/2012 | Kondoh et al. |
| 2014/0152171 A1 | 6/2014 | Kondoh |
| 2015/0044805 A1 | 2/2015 | Ishino et al. |
| 2015/0069391 A1* | 3/2015 | Kanegae ............ H01L 27/1225 257/43 |
| 2015/0364712 A1 | 12/2015 | Lee et al. |
| 2017/0179211 A1 | 6/2017 | Kanaya |
| 2017/0278894 A1 | 9/2017 | Sato et al. |
| 2019/0156740 A1 | 5/2019 | Xu |

FOREIGN PATENT DOCUMENTS

| | | |
|---|---|---|
| EP | 2 874 185 A2 | 5/2015 |
| EP | 3057085 A1 | 8/2016 |
| EP | 3089149 A1 | 11/2016 |
| JP | 2009-129606 A | 6/2009 |
| KR | 10-2006-0026243 A | 3/2006 |
| KR | 10-2016-0033804 A | 3/2016 |
| KR | 10-2017-0052766 A | 5/2017 |
| KR | 10-2017-0080288 A | 7/2017 |
| WO | 2017/074103 A1 | 5/2017 |

* cited by examiner

ELECTROLUMINESCENSE DISPLAY DEVICE

CROSS-REFERENCE TO RELATED APPLICATIONS

This application claims the benefit of the Korean Patent Application No. 10-2017-0184076 filed on Dec. 29, 2017, which is hereby incorporated by reference.

BACKGROUND

Technical Field

The present disclosure relates to an electroluminescent display device, and more particularly, to an electroluminescent display device having an emission layer manufactured by a solution process.

Description of the Related Art

An electroluminescent display device is provided in such way that an emission layer is formed between two electrodes. As the emission layer emits light due to an electric field between the two electrodes, an image is displayed on the electroluminescent display device.

The emission layer may be formed of an organic material which emits light when an exciton is produced by a bond of an electron and a hole, and the exciton falls to a ground state from an excited state, or may be formed of an inorganic material such as a quantum dot.

Hereinafter, a related art electroluminescent display device will be described with reference to the accompanying drawings.

FIG. 1 is a cross sectional view illustrating a related art electroluminescent display device.

As shown in FIG. 1, the related art electroluminescent display device may include a substrate 10, a circuit device layer 20, a first electrode 30, a bank 40, and an emission layer 50.

The circuit device layer 20 is formed on the first substrate 10. Herein, various signal lines, a thin film transistor, and a capacitor are formed in the circuit device layer 20.

The first electrode 30 is formed on the circuit device layer 20. The first electrode 30 is patterned on each pixel, wherein the first electrode 30 functions as an anode of the electroluminescent display device.

The bank 40 is formed in a matrix configuration, to thereby define a plurality of emission areas (E).

The emission layer 50 is formed in each of the plurality of emission areas (E) defined by the bank 40. Specifically, the emission layer 50 is formed on the first electrode 30 which is exposed in the emission area (E) by a solution process using an inkjet apparatus.

Referring to an expanded portion of FIG. 1, which is marked with an arrow, an electrode 22 of a driving thin film transistor is formed in the circuit device layer 20, and an insulating layer 24 is formed on the electrode 22. A contact hole (CH) is provided in the insulating layer 24, whereby the first electrode 30 is connected with the electrode 22 of the driving thin film transistor via the contact hole (CH).

However, in the case of the related art, a step difference (stepped portion) is generated in an upper surface of the first electrode 30 due to the contact hole (CH) provided in the insulating layer 24. If the emission layer 50 is formed on the first electrode 30 with the stepped portion by the solution process, it is difficult to uniformly form the emission layer 50 in the emission area (E), thereby causing non-uniformity of light emission in the emission area (E).

SUMMARY

Accordingly, embodiments of the present disclosure are directed to an electroluminescence display device that substantially obviates one or more of the problems due to limitations and disadvantages of the related art.

The present disclosure has been made in view of the above problems, and an aspect of the present disclosure is to provide an electroluminescent display device capable of forming a uniform emission layer in an emission area by minimizing a step difference therein, and realizing a uniform light emission in the emission area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

In accordance with an aspect of the present disclosure, the above and other objects can be accomplished by the provision of an electroluminescent display device comprising a substrate, a circuit device layer provided on the substrate and configured to include a contact hole, a first electrode provided on the circuit device layer, a bank provided on the first electrode and configured to define a first sub emission area for exposing a first portion of the first electrode, and a second sub emission area for exposing a second portion of the first electrode, a first sub emission layer provided in the first sub emission area, and a second sub emission layer provided in the second sub emission area, wherein an area between the first sub emission area and the second sub emission area is overlapped with the contact hole of the circuit device layer.

In accordance with another aspect of the present disclosure, there is provided an electroluminescent display device comprising a substrate, a high power line and a low power line arranged in a first direction on the substrate, a plurality of circuit device columns provided between the high power line and the low power line on the substrate, and configured to include a plurality of thin film transistors and contact holes, a bank provided on the high power line, the low power line, and the plurality of circuit device columns, and configured to define a plurality of emission areas, and an emission layer provided in each of the plurality of emission areas, wherein the plurality of emission areas includes a first emission area which is overlapped with the high power line and any one circuit device column among the plurality of circuit device columns or overlapped with the low power line and any one circuit device column among the plurality of circuit device columns, and is configured to emit first color light, wherein the first emission area includes first and second sub emission areas spaced from each other with respect to a first contact hole provided in the any one circuit device column.

In accordance with a further aspect of the present disclosure, there is provided an electroluminescent display device comprising a substrate including an active area and a dummy area provided in the periphery of the active area, a bank configured to define an emission area on the active area of the substrate, and a dummy emission area on the dummy area of the substrate, and an emission layer provided in the emission area, and a dummy emission layer provided in the dummy emission area, wherein the emission area includes first and second sub emission areas spaced from each other by the bank, and an area of the dummy emission area is larger than an area obtained by adding an area of the first sub emission area and an area of the second sub emission area.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
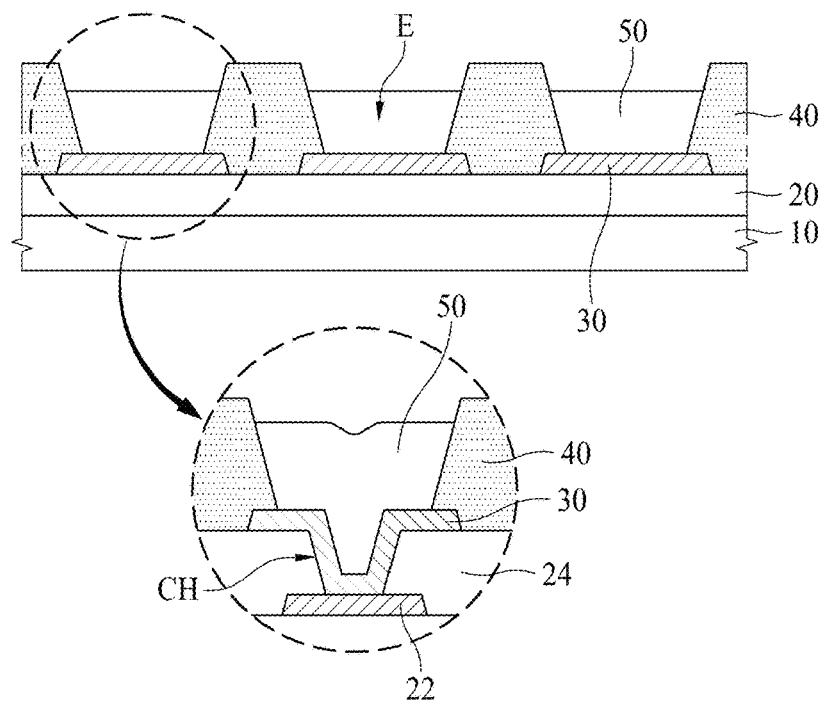
FIG. 1 is a cross sectional view illustrating a related art electroluminescent display device.

Advantages and features of the present disclosure, and implementation methods thereof, will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" are used in the present specification, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or completely coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an electroluminescent display device according to example embodiments of the present disclosure will be described in detail with reference to the accompanying drawings.

Figure 2:
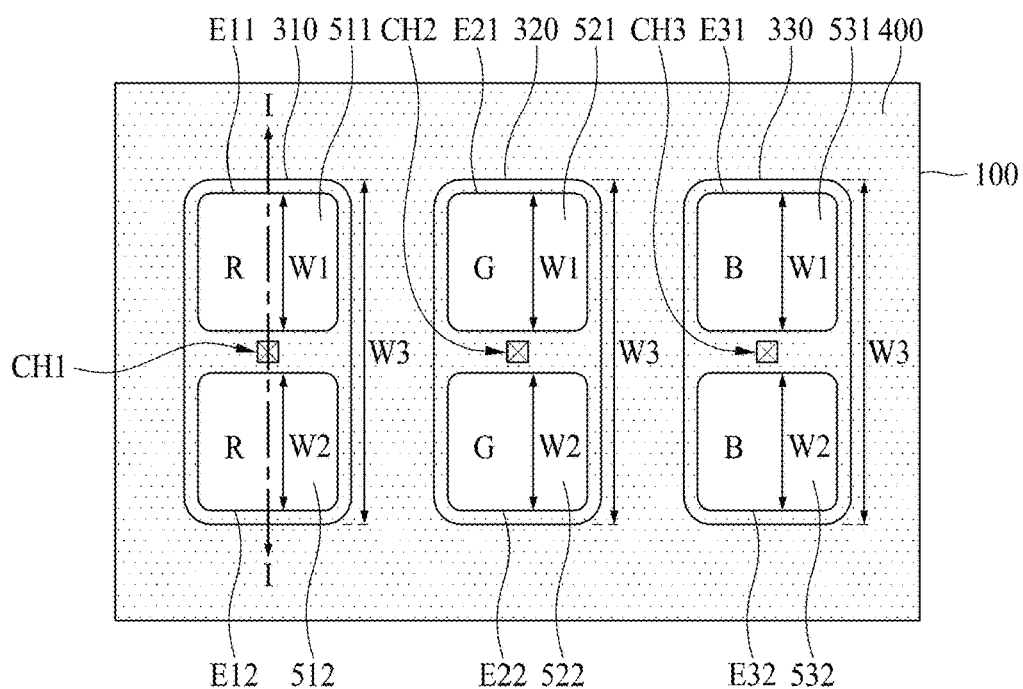
FIG. 2 is a plane view illustrating an electroluminescent display device according to one embodiment of the present disclosure.

FIG. 2 is a plane view illustrating an electroluminescent display device according to one embodiment of the present disclosure.

As shown in FIG. 2 the electroluminescent display device according to one embodiment of the present disclosure may include a substrate 100, a first electrode 310, 320 and 330, a bank 400, a first emission layer 511 and 512, a second emission layer 521 and 522, and a third emission layer 531 and 532.

The substrate 100 may be formed of a glass or plastic material, but is not limited to these materials. The substrate 100 may be formed of a transparent material or an opaque material. If the electroluminescent display device according to one embodiment of the present disclosure is formed as a top emission type where emitted light advances toward an upper side, the substrate 100 may be formed of the opaque material as well as the transparent material.

The plurality of first electrodes 310, 320 and 330 are patterned on each pixel. The plurality of first electrodes 310, 320 and 330 may include the first electrode 310 overlapped with a first emission area (E11, E12), the first electrode 320 overlapped with a second emission area (E21, E22), and the first electrode 330 overlapped with a third emission area (E31, E32).

The first electrode 310 overlapped with the first emission area (E11, E12) has a relatively large sized area in comparison to the first emission area (E11, E12). Specifically, the first electrode 310 overlapped with the first emission area (E11, E12) is overlapped with a spaced area between the first sub emission area (E11) and the second sub emission area (E12) in the first emission area (E11, E12), whereby the first electrode 310 overlapped with the first emission area (E11, E12) is overlapped with a first contact hole (CH1) prepared in the spaced area. Accordingly, the first electrode 310 overlapped with the first emission area (E11, E12) is connected with a terminal of a thin film transistor prepared therebelow via the first contact hole (CH1).

The first electrode 320 overlapped with the second emission area (E21, E22) has a relatively large-sized area in comparison to the second emission area (E21, E22). Specifically, the first electrode 320 overlapped with the second emission area (E21, E22) is overlapped with a spaced area between the first sub emission area (E21) and the second sub emission area (E22) in the second emission area (E21, E22), wherein the first electrode 320 overlapped with the second emission area (E21, E22) is overlapped with a second contact hole (CH2) prepared in the spaced area. Accordingly, the first electrode 320 overlapped with the second emission area (E21, E22) is connected with a terminal of a thin film transistor prepared therebelow via the second contact hole (CH2).

The first electrode 330 overlapped with the third emission area (E31, E32) has a relatively large-sized area in comparison to the third emission area (E31, E32). Specifically, the first electrode 330 overlapped with the third emission area (E31, E32) is overlapped with a spaced area between the first sub emission area (E31) and the second sub emission area (E32) in the third emission area (E31, E32), wherein the first electrode 330 overlapped with the third emission area (E31, E32) is overlapped with a third contact hole (CH3) prepared in the spaced area. Accordingly, the first electrode 330 overlapped with the third emission area (E31, E32) is connected with a terminal of a thin film transistor prepared therebelow via the third contact hole (CH3).

The bank 400 is formed in a matrix configuration on the substrate 100, to thereby define the plurality of emission areas (E11, E12, E21, E22, E31, E32). The bank 400 is formed in the boundary area between each of the first emission area (E11, E12), the second emission area (E21, E22), and the third emission area (E31, E32).

Also, the bank 400 is formed in the spaced area between the first sub emission area (E11) and the second sub emission area (E12) in the first emission area (E11, E12), the spaced area between the first sub emission area (E21) and the second sub emission area (E22) in the second emission area (E21, E22), and the spaced area between the first sub emission area (E31) and the second sub emission area (E32) in the third emission area (E31, E32). Accordingly, the bank 400 is overlapped with the first contact hole (CH1), the second contact hole (CH2), and the third contact hole (CH3).

The limits of the plurality of sub emission areas (E11, E12, E21, E22, E31, E32) are defined by the bank 400. An opening portion in which the bank 400 is not formed becomes the plurality of sub emission areas (E11, E12, E21, E22, E31, E32).

The first sub emission area (E11) and the second sub emission area (E12) in the first emission area (E11, E12) are provided at a predetermined interval from each other under the circumstances that the first contact hole (CH1) is positioned in-between. In this case, the same value of a width (W1) in a first direction of the first sub emission area (E11) for the first emission area (E11, E12) and a width (W2) in the first direction of the second sub emission area (E12) for the first emission area (E11, E12) is favorable to give the first sub emission layer 511 and the second sub emission layer 512 the same profile in the first emission layer 511 and 512. The first direction corresponds to a long-axis direction of the first electrode 310. A width (W3) in the first direction of the first electrode 310 is larger than a total value obtained by adding the width (W1) in the first direction of the first sub emission area (E11) and the width (W2) in the first direction of the second sub emission area (E12).

The first sub emission area (E21) and the second sub emission area (E22) in the second emission area (E21, E22) are provided at a predetermined interval from each other under the circumstances that the second contact hole (CH2) is positioned in-between. In this case, the same value of a width (W1) in a first direction of the first sub emission area (E21) for the second emission area (E21, E22) and a width (W2) in the first direction of the second sub emission area (E22) for the second emission area (E21, E22) is favorable to give the first sub emission layer 521 and the second sub emission layer 522 the same profile in the second emission layer 521 and 522. A width (W3) in the first direction of the first electrode 320 is larger than a total value obtained by adding the width (W1) in the first direction of the first sub emission area (E21) and the width (W2) in the first direction of the second sub emission area (E22).

The first sub emission area (E31) and the second sub emission area (E32) in the third emission area (E31, E32) are provided at a predetermined interval from each other under the circumstances that the third contact hole (CH3) is positioned in-between. In this case, the same value of a width (W1) in a first direction of the first sub emission area (E31) for the third emission area (E31, E32) and a width (W2) in the first direction of the second sub emission area (E32) for the third emission area (E31, E32) is favorable to give the first sub emission layer 531 and the second sub emission layer 532 the same profile in the third emission layer 531 and 532. A width (W3) in the first direction of the first electrode 330 is larger than a total value obtained by adding the width (W1) in the first direction of the first sub emission area (E31) and the width (W2) in the first direction of the second sub emission area (E32).

The bank 400 is provided to cover an edge of the first electrode 310, 320 and 330. Also, the bank 400 is provided to cover an overlap area between the first electrode 310 and the spaced area provided between the first sub emission area (E11) and the second sub emission area (E12) for the first emission area (E11, E12). Also, the bank 400 is provided to cover an overlap area between the first electrode 320 and the spaced area provided between the first sub emission area (E21) and the second sub emission area (E22) for the second emission area (E21, E22). Also, the bank 400 is provided to cover an overlap area between the first electrode 330 and the spaced area provided between the first sub emission area (E31) and the second sub emission area (E32) for the third emission area (E31, E32).

The first emission layer 511 and 512 is formed in the first emission area (E11, E12) defined by the bank 400. In detail, the first sub emission layer 511 of the first emission layer 511 and 512 is formed in the first sub emission area (E11) of the first emission area (E11, E12), and the second sub emission layer 512 of the first emission layer 511 and 512 is formed in the second sub emission area (E12) of the first emission area (E11, E12). As the first sub emission area (E11) and the second sub emission area (E12) are provided at a predetermined interval from each other, the first sub emission layer 511 and the second sub emission layer 512 may be provided at a predetermined interval from each other. The predetermined interval between the first sub emission layer 511 and the second sub emission layer 512 may be the same as the predetermined interval between the first sub emission area (E11) and the second sub emission area (E12). The first sub emission layer 511 and the second sub emission layer 512 are configured to emit the same colored light, for example, red (R) light. Also, the first sub emission layer 511 and the second sub emission layer 512 are configured to emit the light at the same time in accordance with an electric field formed by the first electrode 310 provided below the first and second sub emission layers 511 and 512 and a second electrode provided above the first and second sub emission layers 511 and 512. That is, the first sub emission layer 511 and the second sub emission layer 512 included in the first emission layer 511 and 512 are configured to emit the light at the same time by the driving of the same circuit device.

The second emission layer 521 and 522 is formed in the second emission area (E21, E22) defined by the bank 400. In detail, the first sub emission layer 521 of the second emission layer 521 and 522 is formed in the first sub emission area (E21) of the second emission area (E21, E22), and the second sub emission layer 522 of the second emission layer 521 and 522 is formed in the second sub emission area (E22) of the second emission area (E21, E22). As the first sub emission area (E21) and the second sub emission area (E22) are provided at a predetermined interval from each other, the first sub emission layer 521 and the second sub emission layer 522 may be provided at a predetermined interval from each other. The predetermined interval between the first sub emission layer 521 and the second sub emission layer 522 may be the same as the predetermined interval between the first sub emission area (E21) and the second sub emission area (E22). The first sub emission layer 521 and the second sub emission layer 522 are configured to emit the same colored light, for example, green (G) light. Also, the first sub emission layer 521 and the second sub emission layer 522 are configured to emit the light at the same time in accordance with an electric field formed by the first electrode 320 provided below the first and second sub emission layers 521 and 522 and a second electrode provided above the first and second sub emission layers 521 and 522. That is, the first sub emission layer 521 and the second sub emission layer 522 included in the second emission layer 521 and 522 are configured to emit the light at the same time by the driving of the same circuit device.

The third emission layer 531 and 532 is formed in the third emission area (E31, E32) defined by the bank 400. In detail, the first sub emission layer 531 of the third emission layer 531 and 532 is formed in the first sub emission area (E31) of the third emission area (E31, E32), and the second sub emission layer 532 of the third emission layer 531 and 532 is formed in the second sub emission area (E32) of the third emission area (E31, E32). As the first sub emission area (E31) and the second sub emission area (E32) are provided at a predetermined interval from each other, the first sub emission layer 531 and the second sub emission layer 532 may be provided at a predetermined interval from each other. The predetermined interval between the first sub emission layer 531 and the second sub emission layer 532 may be the same as the predetermined interval between the first sub emission area (E31) and the second sub emission area (E32). The first sub emission layer 531 and the second sub emission layer 532 are configured to emit the same colored light, for example, blue (B) light. Also, the first sub emission layer 531 and the second sub emission layer 532 are configured to emit the light at the same time in accordance with an electric field formed by the first electrode 330 provided below the first and second sub emission layers 531 and 532 and a second electrode provided above the first and second sub emission layers 531 and 532. That is, the first sub emission layer 531 and the second sub emission layer 532 included in the third emission layer 531 and 532 are configured to emit the light at the same time by the driving of the same circuit device.

According to one embodiment of the present disclosure, the first sub emission area (E11) and the second sub emission area (E12) included in the first emission area (E11, E12) are provided at a predetermined interval from each other under the circumstances that the first contact hole (CH1) is provided in-between, whereby the first emission area (E11, E12) is not overlapped with the first contact hole (CH1). Accordingly, a step difference caused by the first contact hole (CH1) is not generated in the first emission area (E11, E12) so that it is possible to realize a uniform profile of the first emission layer 511 and 512 in the first emission area (E11, E12), thereby realizing a uniform light emission in the first emission area (E11, E12).

In the same manner, a step difference caused by the second contact hole (CH2) is not generated in the second emission area (E21, E22) so that it is possible to realize a uniform profile of the second emission layer 521 and 522 in the second emission area (E21, E22), thereby realizing a uniform light emission in the second emission area (E21, E22). Also, a step difference caused by the third contact hole (CH3) is not generated in the third emission area (E31, E32) so that it is possible to realize a uniform profile of the third emission layer 531 and 532 in the third emission area (E31, E32), thereby realizing a uniform light emission in the third emission area (E31, E32).

Figure 3:
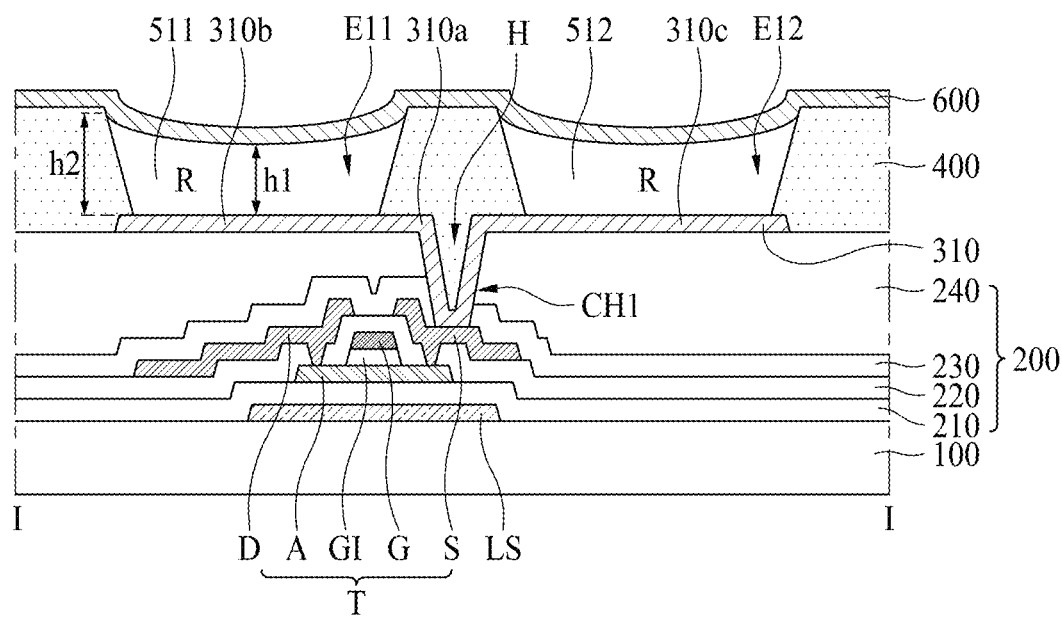
FIG. 3 is a cross sectional view illustrating an electroluminescent display device according to one embodiment of the present disclosure, which corresponds to a cross sectional view along I-I of FIG. 2.

FIG. 3 is a cross sectional view illustrating an electroluminescent display device according to one embodiment of the present disclosure, which is a cross sectional view along I-I of FIG. 2.

As shown in FIG. 3, the electroluminescent display device according to one embodiment of the present disclosure includes a substrate 100, a circuit device layer 200, a first electrode 310, a bank 400, a first emission layer 511 and 512, and a second electrode 600.

The circuit device layer 200 is formed on the substrate 100. The circuit device layer 200 may include a light shielding layer (LS), a thin film transistor (T), a buffer layer 210, an insulating interlayer 220, a passivation layer 230, and a planarization layer 240.

The light shielding layer (LS) is formed on the substrate 100. The light shielding layer (LS) prevents light from being incident on an active layer (A) of the thin film transistor (T). Accordingly, a width of the light shielding layer (LS) is relatively larger than a width of the active layer (A) of the thin film transistor (T). The light shielding layer (LS) may be formed of a conductive material.

The buffer layer 210 is formed on the light shielding layer (LS). Thus, the buffer layer 210 insulates the light shielding layer (LS) from the active layer (A) of the thin film transistor (T).

The thin film transistor (T) includes the active layer (A) provided on the buffer layer 210, a gate insulating film (GI) provided on the active layer (A), a gate electrode (G) provided on the gate insulating film (GI), and source and drain electrodes (S, D) provided on the insulating interlayer 220 and respectively connected with the active layer (A) via contact holes provided in the insulating interlayer 220.

The insulating interlayer 220 is provided between the active layer (A) and the source and drain electrodes (S, D). Also, the insulating interlayer 220 is provided between the gate electrode (G) and the source and drain electrodes (S, D).

The passivation layer 230 is formed on the thin film transistor (T), to thereby protect the thin film transistor (T).

The planarization layer 240 is capable of planarizing an upper surface of the substrate 100 and the elements disposed thereon, and is formed on the passivation layer 230.

The first electrode 310 is formed on the planarization layer 240. The first electrode 310 is connected with the source electrode (S) of the thin film transistor (T) via a first contact hole (CH1) provided in the passivation layer 230 and the planarization layer 240. The first contact hole (CH1) is provided in an area corresponding to an area between a first sub emission area (E11) and a second sub emission area (E12). The first electrode 310 may function as an anode of the electroluminescent display device. If the electroluminescent display device according to one embodiment of the present disclosure is formed as a top emission type, the first electrode 310 may include a reflective material for upwardly reflecting light emitted from a first emission layer 511 and 512. In this case, the first electrode 310 may be formed in a deposition structure of a transparent conductive material and the reflective material.

The bank 400 is formed on the first electrode 310. The bank 400 is provided to cover both ends of the first electrode 310, and to cover an overlap portion 310a of the first electrode 310 which is overlapped with the first contact hole (CH1). Accordingly, the first sub emission area (E11) and the second sub emission area (E12) are defined by the bank 400. A first portion 310b of the first electrode 310, which is not covered by the bank 400, is exposed to the first sub emission area (E11), and a second portion 310c of the first electrode 310, which is not covered by the bank 400, is exposed to the second sub emission area (E12). The first portion 310b of the first electrode 310, which is exposed without being covered by the bank 400, is provided at a predetermined interval from the second portion 310c of the first electrode 310, which is exposed without being covered by the bank 400, under the circumstances that the bank 400 is provided in-between the first portion 310b and the second portion 310c.

The bank 400 may be formed of an organic insulating material that is hydrophilic. In this case, the first emission layer 511 and 512 smoothly spreads to a lateral surface of the bank 400 so that the first sub emission area (E11) and the second sub emission area (E12) may be formed uniformly. Meanwhile, if the entire area of the bank 400 has the hydrophilic property, the first emission layer 511 and 512 formed in the first emission area (E11, E12) overflows into the neighboring emission area over an upper surface of the bank 400, whereby the first emission layer 511 and 512 formed in the first emission area (E11, E12) may be mixed together with the emission layer formed in the neighboring emission area. Thus, the upper surface of the bank 400 has the hydrophobic property so as to prevent the first emission layer 511 and 512 from being mixed with the neighboring emission layer, preferably. To this end, the bank 400 may be obtained by coating a mixture solution of an organic insulating material having the hydrophilic property and a hydrophobic material such as fluorine, and patterning the coated mixture solution by the use of a photolithography process. In response to the light irradiated in the photolithography process, the hydrophobic material such as fluorine may move to an upper portion of the bank 400, such that the upper portion of the bank 400 may have the hydrophobic property, and the remaining portions of the bank 400 may have the hydrophilic property. In this case, the upper surface of the bank 400 has the hydrophobic property so that it is possible to decrease the spread of the first emission layer 511 and 512 into the upper surface of the bank 400 to some degree, thereby reducing a problem related to the mixture of the neighboring emission layers.

The first sub emission layer 511 having the red (R) emitting layer is formed in the first sub emission area (E11) defined by the bank 400. The second sub emission layer 512 having the red (R) emitting layer may be formed in the second sub emission layer (E12) defined by the bank 400.

The first sub emission layer 511 and the second sub emission layer 512 are respectively formed on the first portion 310b and the second portion 310c of the first electrode 310. Each of the first sub emission layer 511 and the second sub emission layer 512 may include at least one organic layer from among a hole injecting layer (HIL), a hole transporting layer (HTL), an emitting material layer (EML), and an electron transporting layer (ETL). In this case, the first sub emission layer 511 and the second sub emission layer 512 may have the same deposition structure, wherein each corresponding deposition layer in the first sub emission layer 511 may be formed of the same material as each corresponding deposition layer in the second sub emission layer 512.

The first sub emission layer 511 and the second sub emission layer 512 may be respectively formed in the first sub emission area (E11) and the second sub emission area (E12) by an inkjet process without using a mask. In this case, a height (h1) of an upper end of the first sub emission layer 511 in the center of the first sub emission area (E11), after a drying process of drying the solution for forming the first sub emission layer 511, is lower than a height (h2) of an upper end of the first sub emission layer 511 at the end of the first sub emission area (E11), and, more particularly, at the end of the first sub emission area (E11) adjacent to the bank 400. As shown in FIG. 3, height (h1) may be a perpendicular distance between the first electrode (310, 320, 330) and the second electrode (600) in a center of a sub emission area. In other words, height (h1) may be the shortest perpendicular distance between the first and second electrodes in the sub emission area. As shown in FIG. 3, height (h2) may be a perpendicular distance the first electrode (310, 320, 330) and the second electrode (600) at a side of a sub emission area. In other words, height (h2) may be the longest perpendicular distance between the first and second electrodes in the sub emission area. As shown in the drawings, as the height of the first sub emission layer 511 is gradually lowered from the end of the first sub emission area (E11) being in contact with the bank 400 to the center of the first sub emission area (E11), it is possible to realize a gradually-lowered profile shape. Accordingly, a portion of a second electrode 600 formed on the first sub emission layer 511 may have a profile corresponding to the profile of the first sub emission layer 511. Also, the second sub emission layer 512 has a profile corresponding to the profile of the first sub emission layer 511, and a portion of a second electrode 600 formed on the second sub emission layer 512 has a profile corresponding to the profile of the second sub emission layer 512.

The second electrode 600 is formed on the first emission layer 511 and 512. The second electrode 600 may function as a cathode of the electroluminescent display device. As the second electrode 600 is formed on the bank 400 as well as on the first emission layer 511 and 512, the second electrode 600 is formed in a plurality of pixels, and also formed in the boundary between each of the plurality of pixels. Thus, the second electrode 600 may function as a common electrode for applying a common voltage to the plurality of pixels. If the electroluminescent display device according to one embodiment of the present disclosure is formed as a top emission type, the second electrode 600 may be formed of a transparent conductive material for upwardly advancing light emitted from the first emission layer 511 and 512, or may be formed at a small thickness so as to improve transmittance.

Although not shown in detail, an encapsulation layer may be additionally formed on the second electrode 600. The encapsulation layer prevents external moisture from being permeated into the first emission layer 511 and 512. The encapsulation layer may be formed of an inorganic insulating material, or may be formed in a deposition structure obtained by alternately depositing an inorganic insulating material and an organic insulating material, but is not limited to these structures.

According to one embodiment of the present disclosure, the overlap portion 310a of the first electrode 310, which extends to the inside of the first contact hole (CH1) and has a stepped structure, is covered by the bank 400. In more detail, the overlap portion 310a of the first electrode 310 is provided with a groove (H) caused by the stepped structure. However, the groove (H) is filled with the bank 400. Accordingly, there is no stepped portion in an upper surface of the first portion 310b of the first electrode 310 exposed to the first sub emission area (E11) or in an upper surface of the second portion 310c of the first electrode 310 exposed to the second sub emission area (E12), whereby it is possible to realize the desired profile in the first sub emission layer 511 formed on the first portion 310b of the first electrode 310 and the second sub emission layer 512 formed on the second portion 310c of the first electrode 310.

Figure 4:
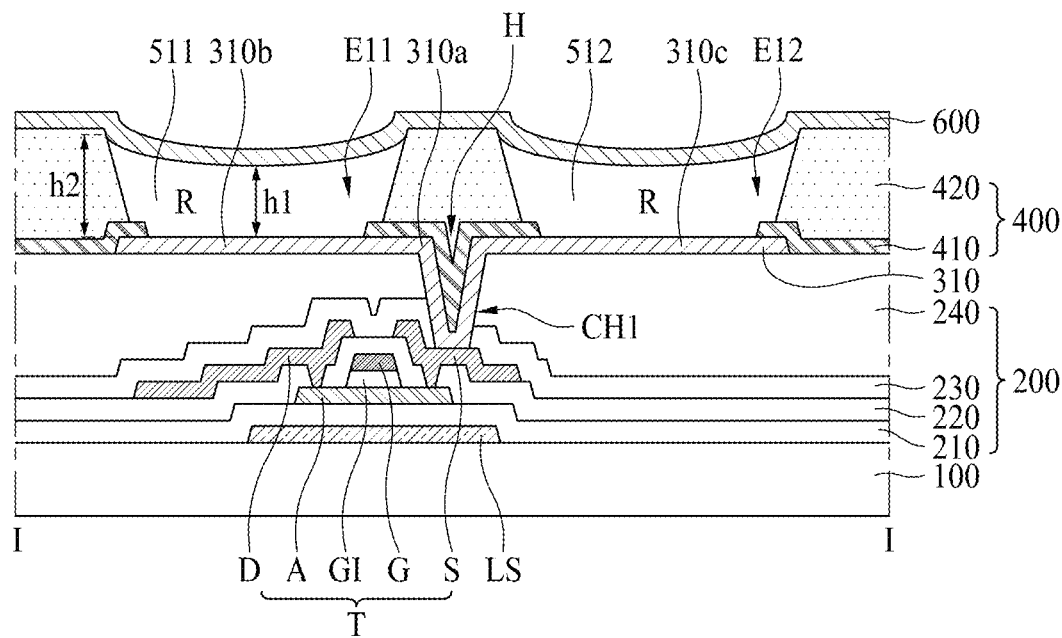
FIG. 4 is a cross sectional view illustrating an electroluminescent display device according to another embodiment of the present disclosure, which corresponds to a cross sectional view along I-I of FIG. 2.

FIG. 4 is a cross sectional view illustrating an electroluminescent display device according to another embodiment of the present disclosure, which is a cross sectional view along I-I of FIG. 2. Except for a differing structure of the bank 400, the electroluminescent display device of FIG. 4 is identical in structure to the electroluminescent display device of FIG. 3, whereby the same reference numbers will be used throughout the drawings to refer to the same parts. Hereinafter, only the different structures will be described in detail as follows.

Referring to FIG. 4, a bank 400 includes a first bank 410 and a second bank 420.

The first bank 410 covers an end of a first electrode 300, and the first bank 410 is formed on a planarization layer 240. A thickness of the first bank 410 is relatively smaller than a thickness of the second bank 420, and a width of the first bank 410 is relatively larger than a width of the second bank 420. In the same manner as described above, the first bank 410 having the above structure has the hydrophilic property. The first bank 410 having the hydrophilic property may be formed of an inorganic insulating material such as silicon oxide. Thus, when the first emission layer 511 and 512 is formed by a solution process, a solution for forming the first emission layer 511 and 512 may spread easily on the first bank 410.

The second bank 420 is formed on the first bank 410. The width of the second bank 420 is smaller than the width of the first bank 410. The second bank 420 may be obtained by coating a mixture solution of an organic insulating material having the hydrophilic property and a hydrophobic material such as fluorine, and patterning the coated mixture solution by the use of a photolithography process. In response to the light irradiated in the photolithography process, the hydrophobic material such as fluorine may move to an upper portion of the second bank 420, whereby the upper portion of the second bank 420 has the hydrophobic property, and the remaining portions of the second bank 420 have the hydrophilic property. That is, the lower portion of the second bank 420 which is in contact with the first bank 410 has the hydrophilic property, and the upper portion of the second bank 420 has the hydrophobic property, but the second bank 420 is not limited to this structure. For example, the entire portions of the second bank 420 may have the hydrophobic property.

Herein, spreadability of the solution for forming the first emission layer 510 may be improved owing to the first bank 410 having the hydrophilic property and the lower portion of the second bank 420 having the hydrophilic property. Specifically, as the first bank 410 has the relatively smaller thickness and the relatively larger width in comparison to the second bank 420, it is possible to prepare a 2-step structure of the hydrophilic property by the combination of the first bank 410 and second bank 420, whereby the solution for forming the first emission layer 510 may easily spread to the left and right ends of each of a first sub emission area (E11) and a second sub emission area (E12).

Also, the upper portion of the second bank 420 having the hydrophobic property prevents the solution for forming the first emission layer 511 and 512 from spreading to another neighboring emission area so that it is possible to prevent the first emission layer 511 and 512 from being mixed with the emission layer of another neighboring emission area.

Figure 5:
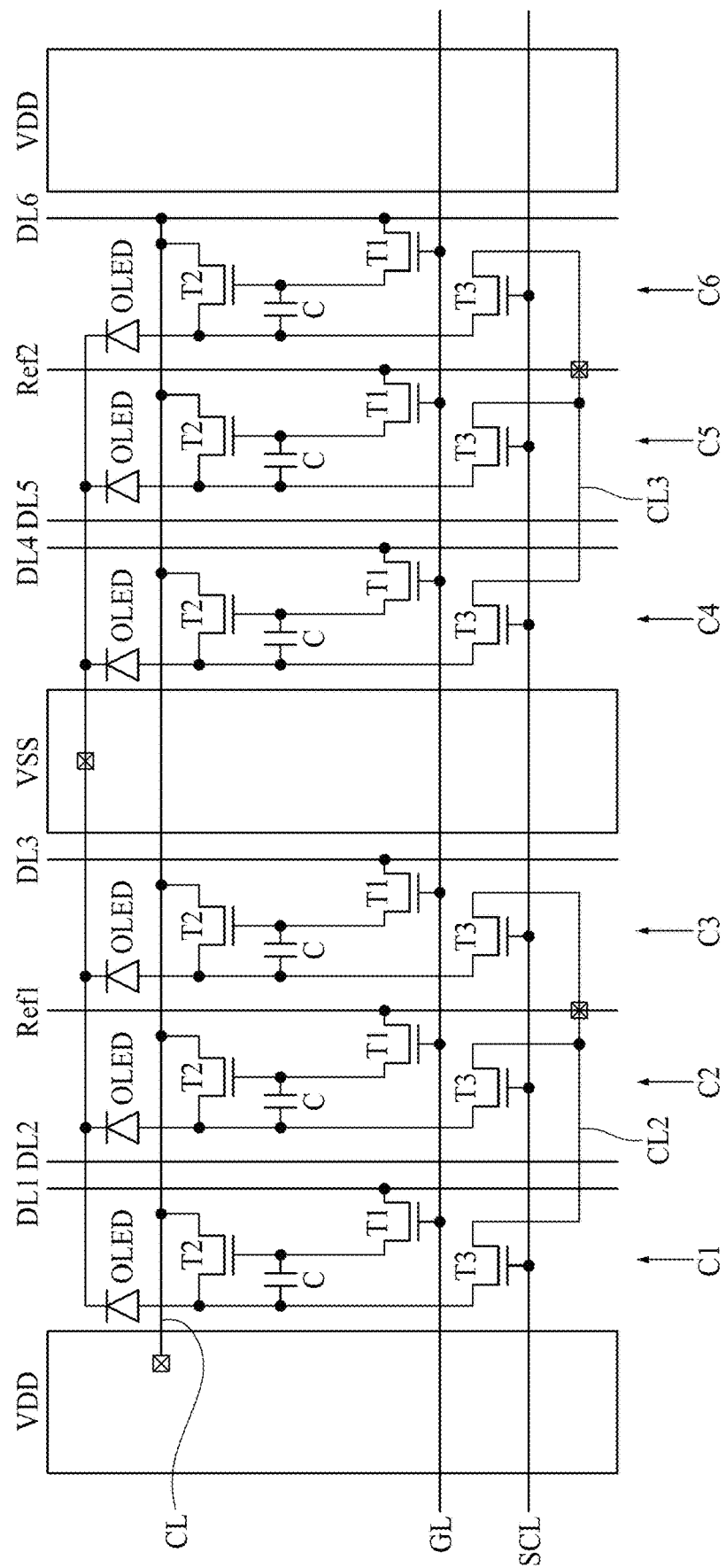
FIG. 5 is a circuit diagram illustrating an electroluminescent display device according to one embodiment of the present disclosure.
Figure 6:
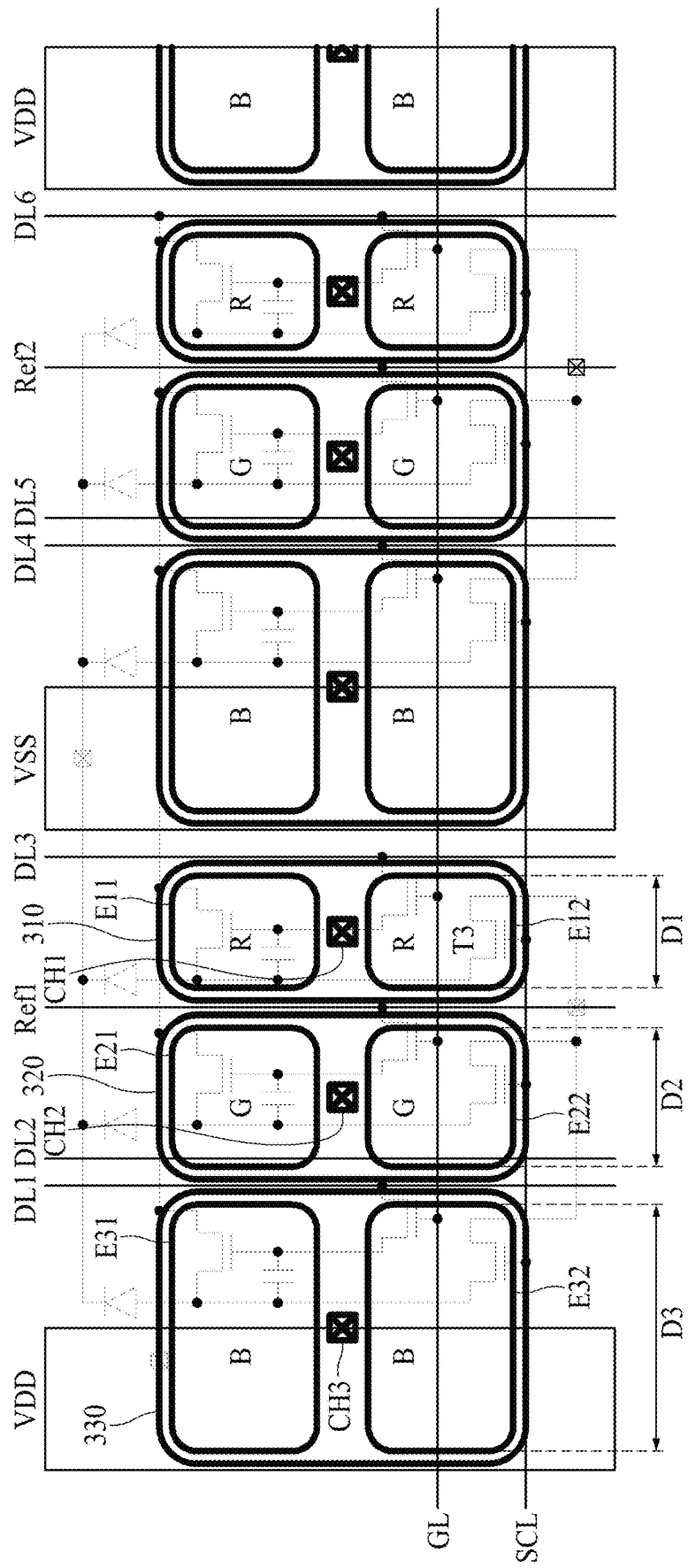
FIG. 6 is a plane view illustrating an electroluminescent display device according to one embodiment of the present disclosure, which shows a plurality of emission areas arranged in a circuit structure of FIG. 5.

FIG. 5 is a circuit diagram illustrating an electroluminescent display device according to one embodiment of the present disclosure. FIG. 6 is a plane view illustrating an electroluminescent display device according to one embodiment of the present disclosure, which shows a plurality of emission areas arranged in a circuit structure of FIG. 5.

As shown in FIG. 5, the electroluminescent display device according to one embodiment of the present disclosure includes a gate line (GL), a sensing control line (SCL), a high power line (VDD), a low power line (VSS), a data line (DL1, DL2, DL3, DL4, DL5, DL6), a reference line (Ref1, Ref2), a switching thin film transistor (T1), a driving thin film transistor (T2), a sensing thin film transistor (T3), a capacitor (C), and an organic light emitting device (OLED).

The gate line (GL) is arranged in a horizontal direction. The gate line (GL) supplies a gate signal to a gate terminal of the switching thin film transistor (T1) provided in each circuit device column (C1, C2, C3, C4, C5, C6).

The sensing control line (SCL) is provided at a predetermined interval from the gate line (GL), and is arranged in the horizontal direction while being parallel to the gate line (GL). The sensing control line (SCL) supplies a sensing control signal to a gate terminal of the sensing thin film transistor (T3) provided in each circuit device column (C1, C2, C3, C4, C5, C6).

The high power line (VDD) is arranged in a vertical direction while being perpendicular to the gate line (GL) and the sensing control line (SCL). The high power line (VDD) supplies high power to a drain terminal of the driving thin film transistor (T2) provided in each circuit device column (C1, C2, C3, C4, C5, C6).

According to one embodiment of the present disclosure, one high power line (VDD) supplies high power to a drain terminal of the driving thin film transistor (T2) provided in each of the six circuit device columns (C1, C2, C3, C4, C5, C6) at the same time. Thus, a first connection line (CL, CL1) is provided to connect one high power line (VDD) with the drain terminal of each driving thin film transistor (T2). The first connection line (CL, CL1) extends in a horizontal direction from one high power line (VDD) to the sixth circuit device column (C6) via the first to third circuit device columns (C1, C2, C3), the low power line (VSS), and the fourth and fifth circuit device columns (C4, C5) in sequence. Thus, the first connection line (CL, CL1) is connected with the high power line (VDD), and is also connected with the drain terminal of the driving thin film transistor (T2) provided in each circuit device column (C1, C2, C3, C4, C5, C6).

The low power line (VSS) is arranged in a vertical direction while being parallel to the high power line (VDD). The low power line (VSS) supplies low power to a cathode of the organic light emitting device (OLED). As the cathode is formed on an entire surface of a substrate, there is no need for a connection line such as the aforementioned first connection line (CL, CL1) so as to connect the low power line (VSS) with the cathode of the individual organic light emitting device (OLED). In detail, the cathode formed on the entire surface of the substrate is connected with the low power line (VSS) via a predetermined contact hole. Thus, the line extending from the individual organic light emitting device (OLED) to the low power line (VSS), which is shown in the drawings, is provided only to show the electrical connection between the cathode of the organic light emitting device (OLED) and the low power line (VSS). In practice, there is no need for the line extending from the individual organic light emitting device (OLED) to the low power line (VSS).

A left-to-right width of the high power line (VDD) and a left-to-right width of the low power line (VSS) are larger than a left-to-right width of the data line (DL1, DL2, DL3, DL4, DL5, DL6). The high power line (VDD) and the low power line (VSS) may be periodically formed by each cycle corresponding to a plurality of pixels instead of being formed by each individual pixel. If the high power line (VDD) and the low power line (VSS) are periodically formed by each cycle of the plurality of pixels, each of the left-to-right width of the high power line (VDD) and the left-to-right width of the low power line (VSS) is larger than a left-to-right width of the data line (DL1, DL2, DL3, DL4, DL5, DL6) formed by each individual pixel so as to realize a stable power supply. The left-to-right width of each of the high power line (VDD), the low power line (VSS), and the data line (DL1, DL2, DL3, DL4, DL5, DL6) indicates the width in a direction perpendicular to a length direction of each of the high power line (VDD), the low power line (VSS), and the data line (DL1, DL2, DL3, DL4, DL5, DL6).

The data line (DL1, DL2, DL3, DL4, DL5, DL6) is arranged in the vertical direction. The data line (DL1, DL2, DL3, DL4, DL5, DL6) is formed between the high power line (VDD) and the low power line (VSS).

The data line (DL1, DL2, DL3, DL4, DL5, DL6) may include the first data line (DL1), the second data line (DL2), the third data line (DL3), the fourth data line (DL4), the fifth data line (DL5), and/or the sixth data line (DL6).

The first data line (DL1) has the high power line (VDD) at its left side, and also has the second data line (DL2) at its right side. In this case, the first data line (DL1) and the high power line (VDD) are provided at a predetermined interval from each other. However, the first data line (DL1) and the second data line (DL2) are positioned adjacent to each other. In detail, a first circuit device column (C1) having circuit devices such as the switching thin film transistor (T1), the driving thin film transistor (T2), the sensing thin film transistor (T3), and the capacitor (C) is formed between the first data line (DL1) and the high power line (VDD). However, the circuit device column (C1, C2, C3) having the above circuit device is not formed between the first data line (DL1) and the second data line (DL2). In this present disclosure, if any one line is provided adjacent to another line, it indicates that the circuit device is not formed therebetween.

The second data line (DL2) is provided adjacent to the first data line (DL1) that is at its left side, and the second data line (DL2) is provided at a predetermined interval from the first reference line (Ref1) that is at its right side under the circumstances that the second circuit device column (C2) is positioned in-between. The third data line (DL3) is provided at a predetermined interval from the first reference line (Ref1) that is at its left side under the circumstances that the third circuit device column (C3) is positioned in-between, and the third data line (DL3) is provided adjacent to the low power line (VSS) that is at its right side. The fourth data line (DL4) is provided at a predetermined interval from the low power line (VSS) that is at its left side under the circumstances that the fourth circuit device column (C4) is positioned in-between, and the fourth data line (DL4) is provided adjacent to the fifth data line (DL5) that is at its right side. The fifth data line (DL5) is provided adjacent to the fourth data line (DL4) that is at its left side, and is provided at a predetermined interval from the second reference line (Ref2) that is at its right side under the circumstances that the fifth circuit device column (C5) is positioned in-between. The sixth data line (DL6) is provided at a predetermined interval from the second reference line (Ref2) that is at its left side under the circumstances that the sixth circuit device column (C6) is positioned in-between, and the sixth data line (DL6) is provided at a predetermined interval from another high power line (VDD) that is at its right side.

At least one data line (DL1, DL2, DL3, DL4, DL5, DL6) may extend in a first direction, the at least one data line being disposed between the first emission area (E11, E12) and a third emission area (E31, E32), wherein a portion of the bank (400) extends between the first emission area and the third emission area in the first direction, the portion of the bank (400) overlapping the at least one data line.

At least one data line (DL1, DL2, DL3, DL4, DL5, DL6) may extend in a first direction, the at least one data line being disposed between the first emission area (E11, E12) and a third emission area (E31, E32), wherein a portion of the second bank (420) extends between the first emission area and the third emission area in the first direction, the portion of the second bank (420) overlapping the at least one data line.

The data line (DL1, DL2, DL3, DL4, DL5, DL6) supplies a data voltage to a source terminal of the switching thin film transistor (T1) provided in each circuit device column (C1, C2, C3, C4, C5, C6).

The reference line (Ref1, Ref2) is arranged in the vertical direction between the high power line (VDD) and the low power line (VSS). The reference line (Ref1, Ref2) may include the first reference line (Ref1) and/or the second reference line (Ref2).

The first reference line (Ref1) is provided at a predetermined interval from the second data line (DL2) that is at its left side under the circumstances that the second circuit device column (C2) is positioned in-between, and the first reference line (Ref1) is provided at a predetermined interval from the third data line (DL3) that is at its right side under the circumstances that the third circuit device column (C3) is positioned in-between.

The second reference line (Ref2) is provided at a predetermined interval from the fifth data line (DL5) that is at its left side under the circumstances that the fifth circuit device column (C5) is positioned in-between, and the second reference line (Ref2) is provided at a predetermined interval from the sixth data line (DL6) that is at its right side under the circumstances that the sixth circuit device column (C6) is positioned in-between.

The reference line (Ref1, Ref2) is connected with a drain terminal of the sensing thin film transistor (T3) provided in each circuit device column (C1, C2, C3, C4, C5, C6).

According to one embodiment of the present disclosure, the first reference line (Ref1) is connected with the drain terminal of the sensing thin film transistor (T3) provided in each of the three circuit device columns (C1, C2, C3). Thus, a second connection line (CL2) is formed to connect the first reference line (Ref1) with the drain terminal in each sensing thin film transistor (T3). The second connection line (CL2) extends in a leftward direction with respect to the first reference line (Ref1) to the first circuit device column (C1) via the second circuit device column (C2), and also extends in a rightward direction to the third circuit device column (C3). Thus, the second connection line (CL2) is connected with the first reference line (Ref1), and is also connected with the drain terminal of the sensing thin film transistor (T3) provided in each circuit device column (C1, C2, C3).

Similarly, the second reference line (Ref2) is connected with the drain terminal of the sensing thin film transistor (T3) provided in each of the three circuit device columns (C4, C5, C6). Thus, a third connection line (CL3) is formed to connect the second reference line (Ref2) with the drain terminal in each sensing thin film transistor (T3). The third connection line (CL3) extends in a leftward direction with respect to the second reference line (Ref2) to the fourth circuit device column (C4) via the fifth circuit device column (C5), and also extends in a rightward direction to the sixth circuit device column (C6). Thus, the third connection line (CL3) is connected with the second reference line (Ref2), and is also connected with the drain terminal of the sensing thin film transistor (T3) provided in each circuit device column (C4, C5, C6).

The switching thin film transistor (T1), the driving thin film transistor (T2), the sensing thin film transistor (T3), and the capacitor (C) are provided in each circuit device column (C1, C,2 C3, C4, C5, C6).

As the switching thin film transistor (T1) is switched in accordance with a gate signal supplied to the gate line (GL), a data voltage provided from the data line (D1, D2, D3, D4, D5, D6) is supplied to the driving thin film transistor (T2) by the use of the switching thin film transistor (T1).

As the driving thin film transistor (T2) is switched in accordance with the data voltage supplied from the switching thin film transistor (T1), a data current is generated by power supplied from the high power line (VDD), and the generated data current is supplied to the organic light emitting device (OLED).

The sensing thin film transistor (T3) senses a threshold voltage deviation of the driving thin film transistor (T2), which causes a deterioration of picture quality. The threshold voltage deviation may be sensed for a sensing mode. The sensing thin film transistor (T3) supplies a voltage of the driving thin film transistor (T2) to the reference line (Ref1, Ref2) in response to a sensing control signal supplied from the sensing control line (SCL).

The capacitor (C) maintains the data voltage supplied to the driving thin film transistor (T2) for one frame period. The capacitor (C) is connected with each of gate and source terminals of the driving thin film transistor (T2).

The organic light emitting device (OLED) emits a predetermined amount of light in accordance with the data current supplied from the driving thin film transistor (T2). The organic light emitting device (OLED) includes an anode, a cathode, and an emitting layer provided between the anode and the cathode. The anode of the organic light emitting device (OLED) is connected with the source terminal of the driving thin film transistor (T2), and the cathode of the organic light emitting device (OLED) is connected with the low power line (VSS).

A structure of the first circuit device column (C1) may be identical to a structure of the fourth circuit device column (C4). That is, an arrangement structure of the thin film transistors (T1, T2, T3) and the capacitor (C) included in the first circuit device column (C1) may be identical to an arrangement structure of the thin film transistors (T1, T2, T3) and the capacitor (C) included in the fourth circuit device column (C4). Also, a structure of the second circuit device column (C2) may identical to a structure of the fifth circuit device column (C5). Also, a structure of the third circuit device column (C3) may be identical to a structure of the sixth circuit device column (C6).

According to one embodiment of the present disclosure, the structure shown in FIG. 5 may be one unit, and the structure shown in FIG. 5 may be repetitively provided on the substrate. That is, the total six circuit device columns (C1, C2, C3, C4, C5, C6) may be formed to use one high power line (VDD) and one low power line (VSS). It is possible to form the circuit device columns with more than six or fewer than six circuit device columns (C1, C2, C3, C4, C5, C6) using one high power line (VDD) and one low power line (VSS).

As described above, considering that the structure of the first circuit device column (C1) is identical to the structure of the fourth circuit device column (C4), the left-to-right width of the high power line (VDD) adjacent to the left side of the first circuit device column (C1) is preferably identical to the left-and-right width of the low power line (VSS) adjacent to the left side of the fourth circuit device column (C4). If the left-to-right width of the high power line (VDD)

is different from the left-to-right width of the low power line (VSS), a capacitance between the high power line (VDD) and the circuit device inside the first circuit device column (C1) is different from a capacitance between the low power line (VSS) and the circuit device inside the fourth circuit device column (C4), whereby a property of the circuit device inside the first circuit device column (C1) and a property of the circuit device inside the fourth circuit device column (C4) may be not uniform.

As shown in FIG. 6, according to one embodiment of the present disclosure, a first emission area (E11, E12) for emitting red (R) light, a second emission area (E21, E22) for emitting green (G) light, and a third emission area (E31, E32) for emitting blue (B) light are prepared on the circuit structure of FIG. 5.

Generally, an emission efficiency of the blue (B) emitting layer may be lower than an emission efficiency in each of the red (R) emitting layer and the green (G) emitting layer. Thus, an area of the blue (B) emitting layer is relatively larger than each of an area of the red (R) emitting layer and an area of the green (G) emitting layer. Also, the emission efficiency of the green (G) emitting layer may be lower than the emission efficiency of the red (R) emitting layer. In this case, the area of the green (G) emitting layer may be larger than the area of the red (R) emitting layer.

Accordingly, a width (D1) in a second direction of the first emission area (E11, E12) may be smaller than a width (D2) in the second direction of the second emission area (E21, E22), and the width (D2) in the second direction of the second emission area (E21, E22) may be smaller than a width (D3) in the second direction of the third emission area (E31, E32). The second direction corresponds to a short-axis direction of the first electrode 310, 320 and 330. Thus, a width in the short-axis direction of the first electrode 310 provided in the first emission area (E11, E12) is smaller than a width in the short-axis direction of the first electrode 320 provided in the second emission area (E21, E22), and a width in the short-axis direction of the first electrode 320 provided in the second emission area (E21, E22) is smaller than a width in the short-axis direction of the first electrode 330 provided in the third emission area (E31, E32), but the arrangement is not limited to this structure. The width (D1) in the second direction of the first emission area (E11, E12) may be identical to the width (D2) in the second direction of the second emission area (E21, E22), whereby the area for the red (R) emitting layer may be identical to the area of the green (G) emitting layer.

The first emission area (E11, E12) and the first electrode 310 provided in the first emission area (E11, E12) may be overlapped with the third circuit device column (C3). Also, the first emission area (E11, E12) and the first electrode 310 provided in the first emission area (E11, E12) may be overlapped with the sixth circuit device column (C6). Specifically, the first emission area (E11, E12) and the first electrode 310 provided in the first emission area (E11, E12) may be overlapped with the switching thin film transistor (T1), the driving thin film transistor (T2), the sensing thin film transistor (T3), and the capacitor (C) provided in each of the third circuit device column (C3) and the sixth circuit device column (C6).

Also, a first contact hole (CH1) is formed between the first sub emission area (E11) and the second sub emission area (E12) included in the first emission area (E11, E12). The first contact hole (CH1) is provided in each of the third circuit device column (C3) and the sixth circuit device column (C6). Accordingly, the first contact hole (CH1) is overlapped with the first electrode 310 provided in the first emission area (E11, E12).

The second emission area (E21, E22) and the first electrode 320 provided in the second emission area (E21, E22) may be overlapped with the second circuit device column (C2). Also, the second emission area (E21, E22) and the first electrode 320 provided in the second emission area (E21, E22) may be overlapped with the fifth circuit device column (C5). Specifically, the second emission area (E21, E22) and the first electrode 320 provided in the second emission area (E21, E22) may be overlapped with the switching thin film transistor (T1), the driving thin film transistor (T2), the sensing thin film transistor (T3), and the capacitor (C) provided in each of the second circuit device column (C2) and the fifth circuit device column (C5).

Also, a second contact hole (CH2) is formed between the first sub emission area (E21) and the second sub emission area (E22) included in the second emission area (E21, E22). The second contact hole (CH2) is provided in each of the second circuit device column (C2) and the fifth circuit device column (C5). Accordingly, the second contact hole (CH2) is overlapped with the first electrode 320 provided in the second emission area (E21, E22).

The third emission area (E31, E32) and the first electrode 330 provided in the third emission area (E31, E32) may be overlapped with the first circuit device column (C1) and the high power line (VDD). Also, the third emission area (E31, E32) and the first electrode 330 provided in the third emission area (E31, E32) may be overlapped with the fourth circuit device column (C4) and the low power line (VSS). Specifically, the third emission area (E31, E32) and the first electrode 330 provided in the third emission area (E31, E32) may be overlapped with the switching thin film transistor (T1), the driving thin film transistor (T2), the sensing thin film transistor (T3), and the capacitor (C) provided in each of the first circuit device column (C1) and the fourth circuit device column (C4).

Also, a third contact hole (CH3) is formed between the first sub emission area (E31) and the second sub emission area (E32) included in the third emission area (E31, E32). The third contact hole (CH3) is provided in each of the first circuit device column (C1) and the fourth circuit device column (C4). Accordingly, the third contact hole (CH3) is overlapped with the first electrode 330 provided in the third emission area (E31, E32).

In this case, the first contact hole (CH1), the second contact hole (CH2), and the third contact hole (CH3) may be positioned on a straight line, whereby a size ratio of the first sub emission area (E11) and the second sub emission area (E12) included in the first emission area (E11, E12) may be identical to a size ratio of the first sub emission area (E21) and the second sub emission area (E22) included in the second emission area (E21, E22) and a size ratio of the first sub emission area (E31) and the second sub emission area (E32) included in the third emission area (E31, E32).

Figure 7:
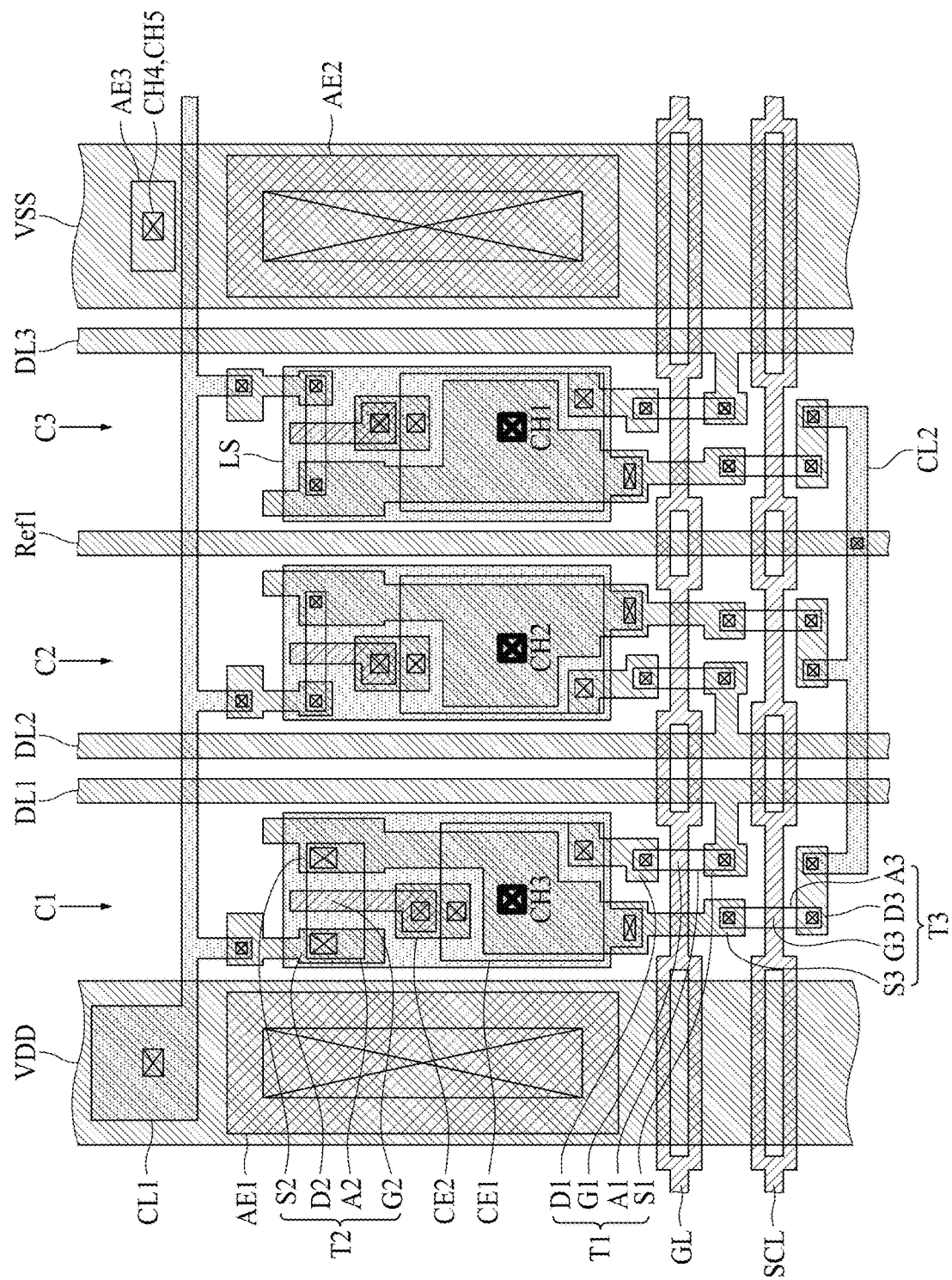
FIG. 7 is a plane view illustrating an electroluminescent display device according to one embodiment of the present invention, which has a circuit structure of FIG. 5.

FIG. 7 is a plane view illustrating an electroluminescent display device according to one embodiment of the present disclosure, which has a circuit structure corresponding to that of FIG. 5. In FIG. 7, a structure of the fourth to sixth circuit device columns (C4, C5, C6) shown in FIG. 5 will be omitted.

As shown in FIG. 7, a gate line (GL) and a sensing control line (SCL) are arranged in a horizontal direction, and a high power line (VDD), a low power line (VSS), a data line (DL1, DL2, DL3), and a first reference line (Ref1) are arranged in a vertical direction.

The gate line (GL) and the sensing control line (SCL) are positioned in the same layer, and are formed of the same material. The high power line (VDD), the low power line (VSS), the data line (DL1, DL2, DL3), and the first reference line (Ref1) are positioned in the same layer, and are formed of the same material. A detailed structure of each line is the same as that of FIG. 5, whereby a detailed description for the same parts will be omitted.

A first circuit device column (C1) is prepared between the high power line (VDD) and the first data line (DL1). In the first circuit device column (C1), there are a switching thin film transistor (T1), a driving thin film transistor (T2), and a sensing thin film transistor (T3).

The switching thin film transistor (T1) provided in the first circuit device column (C1) may include a first gate electrode (G1), a first source electrode (S1), a first drain electrode (D1), and a first active layer (A1).

The first gate electrode (G1) may be formed of one portion of the gate line (GL), but is not limited to this structure. For example, the first gate electrode (G1) may be formed in a structure diverged from the gate line (GL).

The first source electrode (S1) may be formed in a structure diverged from the first data line (DL1).

The first drain electrode (D1) and the first source electrode (S1) confronting each other are formed in the same layer. The first drain electrode (D1) is connected with a second gate electrode (G2) of the driving thin film transistor (T2) via a connection electrode (CE1, CE2).

The connection electrode (CE1, CE2) may include the first connection electrode (CE1) and the second connection electrode (CE2). The first connection electrode (CE1) is connected with the first drain electrode (D1) via one contact hole (x), and is connected with the second connection electrode (CE2) via another contact hole (x). The first connection electrode (CE1) has a relatively large size so that it is possible to improve a capacitance of a capacitor (C). The second connection electrode (CE2) is connected with each of the first connection electrode (CE1) and the second gate electrode (G2) of the driving thin film transistor (T2) via the individual contact holes (x). The first connection electrode (CE1) is formed in the same layer as the first active layer (A1), and the second connection electrode (CE2) is formed in the same layer as the first source electrode (S1) and the first drain electrode (D1).

The first active layer (A1) is connected with each of the first source electrode (S1) and the first drain electrode (D1) via the individual contact holes (x), whereby the first active layer (A1) functions as an electron shift channel.

The driving thin film transistor (T2) provided in the first circuit device column (C1) may include a second gate electrode (G2), a second source electrode (S2), a second drain electrode (D2), and a second active layer (A2).

As described above, the second gate electrode (G2) may be connected with the first drain electrode (D1) of the switching thin film transistor (T1) via the connection electrode (CE1, CE2). The second gate electrode (G2) and the first gate electrode (G1) may be formed in the same layer.

The second source electrode (S2) confronts with the second drain electrode (D2), and the second source electrode (S2) extends in a low-and-upper (i.e. vertical) direction. The second source electrode (S2) has a relatively large size so that it is possible to improve a capacitance of a capacitor (C). The second source electrode (S2) is connected with an anode of an organic light emitting device via a third contact hole (CH3). A position of the third contact hole (CH3) may be changed appropriately. The second source electrode (S2) is connected with a third source electrode (S3) of the sensing thin film transistor (T3). The second source electrode (S2) and the third source electrode (S3) may be formed as one body.

The second drain electrode (D2) is connected with the high power line (VDD) via a first connection line (CL, CL1). The first connection line (CL, CL1) is connected with each of the high power line (VDD) and the second drain electrode (D2) via individual contact holes (x). The first connection line (CL, CL1) may be formed in the lowermost layer on a substrate, that is, may be formed right on an upper surface of the substrate. The second source electrode (S2) and the second drain electrode (D2) may be positioned in the same layer as the first source electrode (S1) and the first drain electrode (D1), and may be formed of the same material as those of the first source electrode (S1) and the first drain electrode (D1).

The second active layer (A2) is connected with each of the second source electrode (S2) and the second drain electrode (D2) via the individual contact holes (x), whereby the second active layer (A2) functions as an electron shift channel. The second active layer (A2) and the first active layer (A1) are positioned in the same layer, and are formed of the same material.

The sensing thin film transistor (T3) provided in the first circuit device column (C1) may include a third gate electrode (G3), a third source electrode (S3), a third drain electrode (D3), and a third active layer (A3).

The third gate electrode (G3) may be formed of one portion of the sensing control line (SCL), but is not limited to this structure. For example, the third gate electrode (G3) may be diverged from the sensing control line (SCL).

As described above, the third source electrode (S3) may be formed as one body with the second source electrode (S2) of the driving thin film transistor (T2).

The third drain electrode (D3) and the third source electrode (S3) confronting each other may be formed in the same layer. The third drain electrode (D3) is connected with the first reference line (Ref1) via a second connection line (CL2). The second connection line (CL2) is connected with each of the third drain electrode (D3) and the first reference line (Ref1) via the individual contact holes (x). The second connection line (CL2) may be positioned in the same layer as the first connection line (CL, CL1), and may be formed of the same material as the first connection line (CL, CL1).

The third active layer (A3) is connected with each of the third source electrode (S3) and the third drain electrode (D3) via the individual contact holes (x), whereby the third active layer (A3) functions as an electron shift channel. The third active layer (A3) may be positioned in the same layer as the first active layer (A1), and may be formed of the same material as the first active layer (A1).

Also, a light shielding layer (LS) is formed in the first circuit device column (C1). The light shielding layer (LS) prevents light from being incident on the second active layer (A2) of the driving thin film transistor (T2). Accordingly, the light shielding layer (LS) has a relatively large sized area in comparison to the second active layer (A2), and the light-shielding layer (LS) is overlapped with the second active layer (A2). The light shielding layer (LS) extends to an area below the second source electrode (S2), and the light shielding layer (LS) is overlapped with the connection electrode (CE1, CE2), to thereby improve a capacitance of a capacitor (C). In this case, the light shielding layer (LS) is formed of a conductive material, and may be connected with the second source electrode (S2) via the contact hole (x). The light shielding layer (LS) may be positioned in the same layer as the first connection line (CL, CL1) and the second connection layer (CL2), and may be formed of the same material as the first connection line (CL, CL1) and the second connection line (CL2).

A second circuit device column (C2) is prepared between the second data line (DL2) and the first reference line (Ref1). In the second circuit device column (C2), there are a switching thin film transistor (T1), a driving thin film transistor (T2), and a sensing thin film transistor (T3).

Except that a first source electrode (S1) is diverged from the second data line (DL2), the switching thin film transistor (T1) provided in the second circuit device column (C2) is identical in electrical connection structure to the switching thin film transistor (T1) provided in the first circuit device column (C1).

Except that a second source electrode (S2) is connected with an anode of an organic light emitting device via a second contact hole (CH2), the driving thin film transistor (T2) provided in the second circuit device column (C2) is identical in electrical connection structure to the driving thin film transistor (T2) provided in the first circuit device column (C1). A position of the second contact hole (CH2) may be changed appropriately.

The sensing thin film transistor (T3) provided in the second circuit device column (C2) is identical in electrical connection structure to the sensing thin film transistor (T3) provided in the first circuit device column (C1).

Also, a light shielding layer (LS), which is identical to that of the first circuit device column (C1), is formed in the second circuit device column (C2).

A third circuit device column (C3) is prepared between the first reference line (Ref1) and the third data line (DL3). In the third circuit device column (C3), there are a switching thin film transistor (T1), a driving thin film transistor (T2), and a sensing thin film transistor (T3).

Except that a first source electrode (S1) is diverged from the third data line (DL3), the switching thin film transistor (T1) provided in the third circuit device column (C3) is identical in electrical connection structure to the switching thin film transistor (T1) provided in the first circuit device column (C1).

Except that a second source electrode (S2) is connected with an anode of an organic light emitting device via a first contact hole (CH1), the driving thin film transistor (T2) provided in the third circuit device column (C3) is identical in electrical connection structure to the driving thin film transistor (T2) provided in the first circuit device column (C1). A position of the first contact hole (CH1) may be changed appropriately.

The sensing thin film transistor (T3) provided in the third circuit device column (C3) is identical in electrical connection structure to the sensing thin film transistor (T3) provided in the first circuit device column (C1).

Also, a light shielding layer (LS), which is identical to that of the first circuit device column (C1), is formed in the third circuit device column (C3).

Meanwhile, the high power line (VDD) and the low power line (VSS) may be respectively overlapped with auxiliary electrodes (AE1, AE2). The first auxiliary electrode (AE1) is connected with the high power line (VDD) via the contact hole (x), and the second auxiliary electrode (AE2) is connected with the low power line (VSS) via the contact hole (x). The first auxiliary electrode (AE1) extends in a lengthwise (i.e. vertical) direction of the high power line (VDD) below the high power line (VDD), and the first auxiliary electrode (AE1) may be overlapped with the high power line (VDD). The second auxiliary electrode (AE2) extends in a lengthwise (i.e. vertical) direction of the low power line (VSS) below the low power line (VSS), and the second auxiliary electrode (AE2) may be overlapped with the low power line (VSS). The first auxiliary electrode (AE1) and the second auxiliary electrode (AE2) may be positioned in the same layer as the first connection line (CL, CL1), the second connection line (CL2), and the light shielding layer (LS), and may be formed of the same material as the first connection line (CL, CL1), the second connection line (CL2), and the light shielding layer (LS). In order to prevent a short, each of the first auxiliary electrode (AE1) and the second auxiliary electrode (AE2) is provided at a predetermined interval from the first connection line (CL, CL1).

Also, the low power line (VSS) may be additionally overlapped with a third auxiliary electrode (AE3). The third auxiliary electrode (AE3) is formed between the low power line (VSS) and a cathode of an organic light emitting device so that the low power line (VSS) and the cathode of the organic light emitting device are connected with each other by the use of third auxiliary electrode (AE3). The third auxiliary electrode (AE3) is positioned in the same layer as the anode of the organic light emitting device, and is formed of the same material as the anode of the organic light emitting device. The third auxiliary electrode (AE3) is connected with the low power line (VSS) positioned therebelow via a fourth contact hole (CH4), and is also connected with the cathode of the organic light emitting device positioned thereabove via a fifth contact hole (CH5).

Figure 8:
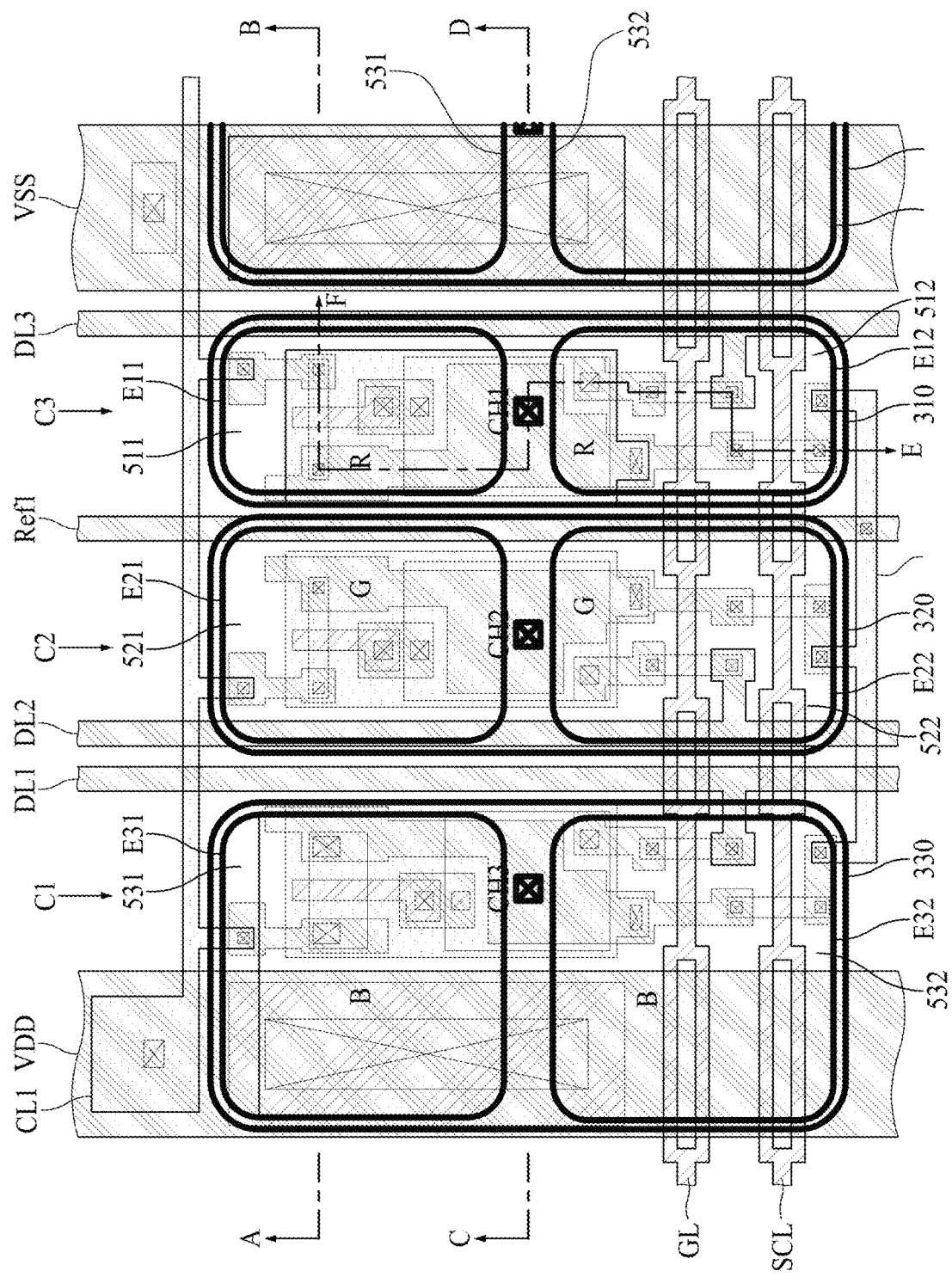
FIG. 8 is a plane view illustrating one embodiment of a plurality of emission areas arranged in an electroluminescent display device of FIG. 7.

FIG. 8 is a plane view illustrating an electroluminescent display device according to one embodiment of the present disclosure, which shows a plurality of emission areas arranged in a circuit structure corresponding to that of FIG. 7.

As shown in FIG. 8, a first emission area (E11, E12) is overlapped with a third circuit device column (C3). In detail, a first sub emission area (E11) of the first emission area (E11, E12) is overlapped with a driving thin film transistor (T2) of the third circuit device column (C3), and a second sub emission area (E12) of the first emission area (E11, E12) is overlapped with a switching thin film transistor (T1) of the third circuit device column (C3) and a sensing thin film transistor (T3) of the third circuit device column (C3).

The first emission area (E11, E12) is overlapped with a first electrode 310 which functions as an anode of an organic light emitting device. An area of the first electrode 310 overlapped with the first emission area (E11, E12) is relatively larger than an area of the first emission area (E11, E12).

The first electrode 310 overlapped with the first emission area (E11, E12) is overlapped with the third circuit device column (C3), and may be overlapped with a third data line (DL3). If needed, the first electrode 310 overlapped with the first emission area (E11, E12) may be overlapped with a first reference line (Ref1). The first electrode 310 overlapped with the first emission area (E11, E12) is connected with a second source electrode (S2) of a driving thin film transistor (T2) provided in the third circuit device column (C3) via a first contact hole (CH1).

A second emission area (E21, E22) is overlapped with a second circuit device column (C2). In detail, a first sub emission area (E21) of the second emission area (E21, E22) is overlapped with a driving thin film transistor (T2) of the second circuit device column (C2), and a second sub emission area (E22) of the second emission area (E21, E22) is overlapped with a switching thin film transistor (T1) of the second circuit device column (C2) and a sensing thin film transistor (T3) of the second circuit device column (C2).

The second emission area (E21, E22) is overlapped with a first electrode 320 which functions as an anode of an organic light emitting device. An area of the first electrode 320 overlapped with the second emission area (E21, E22) is relatively larger than an area of the second emission area (E21, E22).

The first electrode 320 overlapped with the second emission area (E21, E22) is overlapped with the second circuit device column (C2), and may be overlapped with a second data line (DL2) and the first reference line (Ref1). The first electrode 320 overlapped with the second emission area (E21, E22) is connected with a second source electrode (S2) of a driving thin film transistor (T2) provided in the second circuit device column (C2) via a second contact hole (CH2).

A third emission area (E31, E32) is overlapped with a high power line (VDD) and a first circuit device column (C1). In detail, a first sub emission area (E31) of the third emission area (E31, E32) is overlapped with one portion of the high power line (VDD) and a driving thin film transistor (T2) of the first circuit device column (C1), and a second sub emission area (E32) of the third emission area (E31, E32) is overlapped with another portion of the high power line (VDD), and a switching thin film transistor (T1) of the first circuit device column (C1) and a sensing thin film transistor (T3) of the first circuit device column (C1).

The third emission area (E31, E32) is overlapped with a first electrode 330 which functions as an anode of an organic light emitting device. An area of the first electrode 330 overlapped with the third emission area (E31, E32) is relatively larger than an area of the third emission area (E31, E32).

The first electrode 330 overlapped with the third emission area (E31, E32) may be overlapped with the high power line (VDD) and the first circuit device column (C1). If needed, the first electrode 330 overlapped with the third emission area (E31, E32) may be overlapped a first data line (DL1). The first electrode 330 overlapped with the third emission area (E31, E32) is connected with a second source electrode (S2) of a driving thin film transistor (T2) provided in the first circuit device column (C1) via a third contact hole (CH3).

The third emission area (E31, E32) and the first electrode 330 overlapped with the third emission area (E31, E32) may be overlapped with a low power line (VSS) and a fourth circuit device column (C4) positioned adjacent to the low power line (VSS).

A light emission of the first emission area (E11, E12) is controlled by a circuit device provided in the third circuit device column (C3), a light emission of the second emission area (E21, E22) is controlled by a circuit device provided in the second circuit device column (C2), and a light emission of the third emission area (E31, E32) is controlled by a circuit device provided in the first circuit device column (C1).

In this case, the first emission area (E11, E12) is overlapped with the third circuit device column (C3), and the second emission area (E21, E22) is overlapped with the second circuit device column (C2). The third emission area (E31, E32) is overlapped with the first circuit device column (C1), and may be additionally overlapped with the high power line (VDD).

Hereinafter, a cross sectional structure of an electroluminescent display device shown in FIG. 8 will be described in detail as follows.

Figure 9:
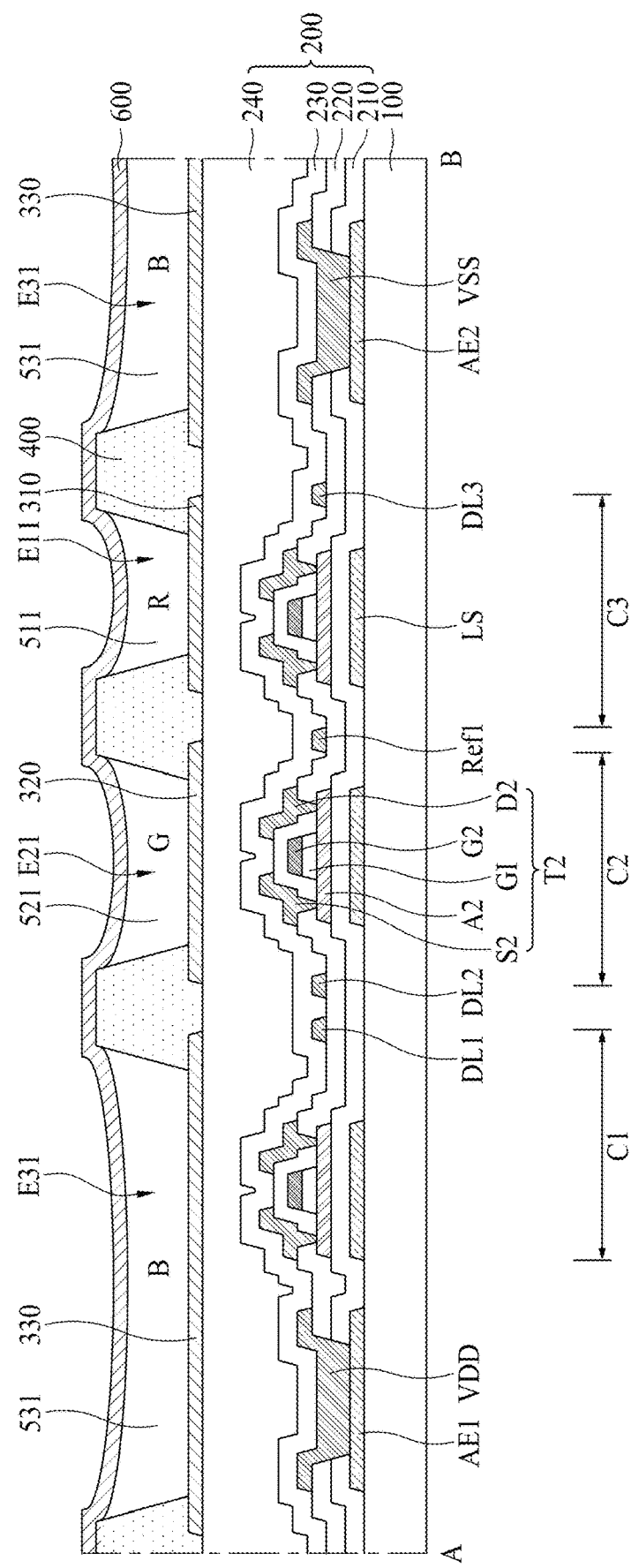
FIG. 9 is a cross sectional view along A-B of FIG. 8.

FIG. 9 is a cross sectional view along A-B of FIG. 8. That is, FIG. 9 corresponds to a cross section of an area where a driving thin film transistor (T2) for each individual circuit device column (C1, C2, C3) is formed.

As shown in FIG. 9, a circuit device layer 200, a first electrode 310, 320 and 330, a bank 400, a sub emission layer 511, 521 and 531, and a second electrode 600 are formed on a substrate 100.

The circuit device layer 200 includes an auxiliary electrode (AE1, AE2), a light shielding layer (LS), a high power line (VDD), a low power line (VSS), a driving thin film transistor (T2), a data line (DL1, DL2, DL3), a first reference line (Ref1), a buffer layer 210, an insulating interlayer 220, a passivation layer 230, and a planarization layer 240.

The auxiliary electrode (AE1, AE2) may include first and second auxiliary electrodes (AE1, AE2) formed on the substrate 100. The first auxiliary (AE1) is provided below the high power line (VDD), and the second auxiliary electrode (AE2) is provided below the low power line (VSS).

The light shielding layer (LS) is formed in each of first to third circuit device columns (C1, C2, C3) on the substrate 100. The light shielding layer (LS) may be positioned in the same layer as the auxiliary electrode (AE1, AE2), and may be formed of the same material as that of the auxiliary electrode (AE1, AE2).

The high power line (VDD) is provided on the first auxiliary electrode (AE1). In more detail, the buffer layer 210 and the insulating interlayer 220 are sequentially formed on the first auxiliary electrode (AE1), and the high power line (VDD) is formed on the insulating interlayer 220. The high power line (VDD) is connected with the first auxiliary electrode (AE1) via a contact hole provided in the buffer layer 210 and the insulating interlayer 220.

The low power line (VSS) is provided on the second auxiliary electrode (AE2). In more detail, the buffer layer 210 and the insulating interlayer 220 are sequentially formed on the second auxiliary electrode (AE2), and the low power line (VSS) is formed on the insulating interlayer 220. The low power line (VSS) is connected with the second auxiliary electrode (AE2) via a contact hole provided in the buffer layer 210 and the insulating interlayer 220.

The driving thin film transistor (T2) is provided in each of the first to third circuit device columns (C1, C2, C3). The driving thin film transistor (T2) may include a second active layer (A2) provided on the buffer layer 210, a gate insulating film (GI) provided on the second active layer (A2), a second gate electrode (G2) provided on the gate insulating film (GI), and second source and drain electrodes (S2, D2) provided on the insulating interlayer 220 and respectively connected with the second active layer (A2) via contact holes provided in the insulating interlayer 220. A width of the second active layer (A2) may be smaller than a width of the light shielding layer (LS).

The data line (DL1, DL2, DL3) is provided on the insulating interlayer 220. The data line (DL1, DL2, DL3) may include the first and second data lines (DL1, DL2) provided between the first circuit device column (C1) and the second circuit device column (C2), and the third data line (DL3) provided between the third circuit device column (C3) and the low power line (VSS).

The first reference line (Ref1) is formed on the insulating interlayer 220. The first reference line (Ref1) is provided between the second circuit device column (C2) and the third circuit device column (C3).

The high power line (VDD), the low power line (VSS), the second source electrode (S2), the second drain electrode (D2), the data line (DL1, DL2, DL3), and the first reference line (Ref1), which are provided on the insulating interlayer 220, may be formed of the same material.

The passivation layer 230 is formed on the high power line (VDD), the low power line (VSS), the second source electrode (S2), the second drain electrode (D2), the data line (DL1, DL2, DL3), and the first reference line (Ref1).

The planarization layer 240 is formed on the passivation layer 230.

The first electrode 310, 320 and 330 is formed on the planarization layer 240. The first electrode 310, 320 and 330 is patterned to correspond to the sub emission area (E11, E21, E31).

The first electrode 310 overlapped with the first sub emission area (E11) of the first emission area (E11, E12) is overlapped with the third circuit device column (C3). Also, the first electrode 320 overlapped with the first sub emission area (E21) of the second emission area (E21, E22) is overlapped with the second circuit device column (C2). Also, the first electrode 330 overlapped with the first sub emission area (E31) of the third emission area (E31, E32) is overlapped with the high power line (VDD) and the first circuit device column (C1). Also, the first electrode 330 overlapped with the first sub emission area (E31) of the third emission area (E31, E32) is overlapped with the low power line (VSS) and the fourth circuit device column (C4 of FIG. 5) positioned adjacent to the low power line (VSS).

The bank 400 is configured to cover both ends of the first electrode 310, 320 and 330, and is provided on the planarization layer 240. The sub emission area (E11, E21, E31) is defined by the bank 400.

The first sub emission area (E11) of the first emission area (E11, E12) is overlapped with the third circuit device column (C3), the first sub emission area (E21) of the second emission area (E21, E22) is overlapped with the second circuit device column (C2), and the first sub emission area (E31) of the third emission area (E31, E32) is overlapped with the high power line (VDD) and the first circuit device column (C1). Also, the first sub emission area (E31) of the third emission area (E31, E32) is overlapped with the low power line (VSS) and the fourth circuit device column (C4 of FIG. 5) positioned adjacent to the low power line (VSS).

The sub emission layer 511, 521 and 531 is individually formed in the sub emission area (E11, E21, E31). The sub emission layer 511, 521, and 531 may include the first sub emission layer 511 of the red (R) emitting layer formed on the first electrode 310, the first sub emission layer 521 of the green (G) emitting layer formed on the first electrode 320, and the first sub emission layer 531 of the blue (B) emitting layer formed on the first electrode 330.

The second electrode 600 is formed on the sub emission layer 511, 521 and 531. The second electrode 600 is formed on the bank 400, whereby the second electrode 600 may be formed in the plurality of pixels, and also formed in the boundary area between each of the plurality of pixels.

Figure 10:
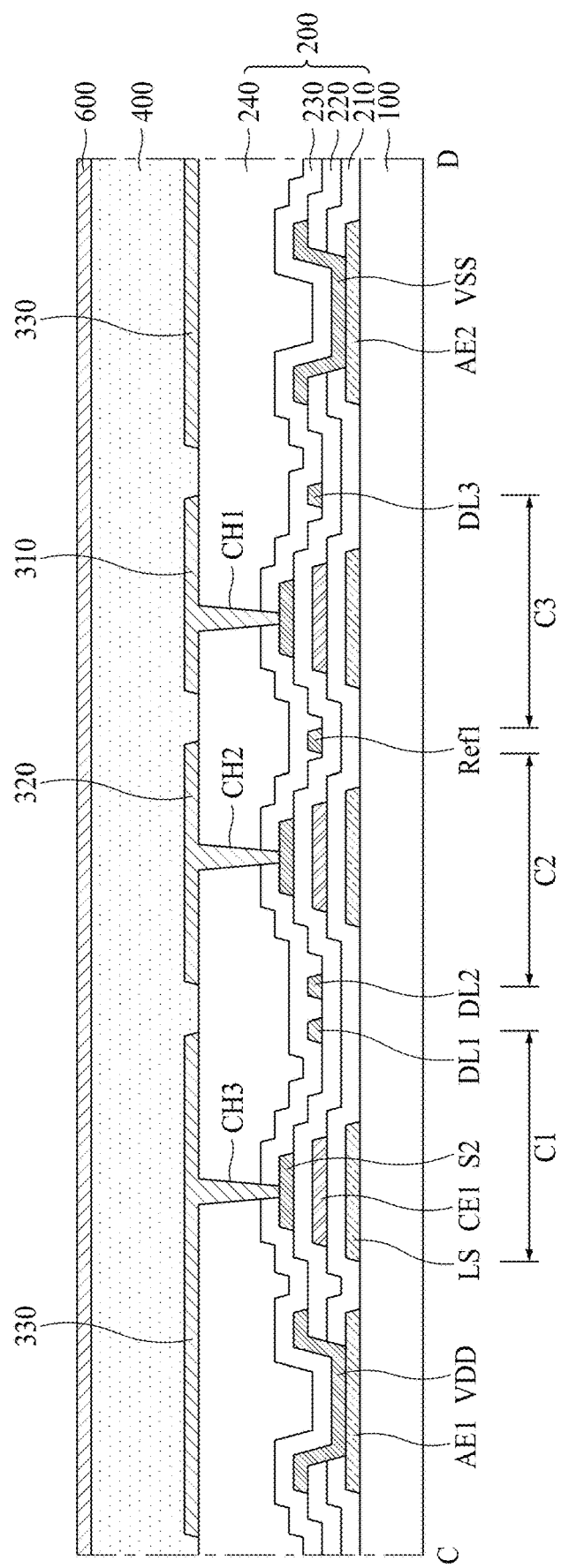
FIG. 10 is a cross sectional view along C-D of FIG. 8.

FIG. 10 is a cross sectional view along C-D of FIG. 8. That is, FIG. 10 corresponds to a cross section of a contact hole (CH1, CH2, CH3) area provided in each individual circuit device column (C1, C2, C3).

As shown in FIG. 10, a circuit device layer 200, a first electrode 310, 320 and 330, a bank 400, and a second electrode 600 are formed on a substrate 100.

The circuit device layer 200 includes an auxiliary electrode (AE1, AE2), a light shielding layer (LS), a high power line (VDD), a low power line (VSS), a first connection electrode (CE1), a second source electrode (S2), a data line (DL1, DL2, DL3), a first reference line (Ref1), a buffer layer 210, an insulating interlayer 220, a passivation layer 230, and a planarization layer 240.

The auxiliary electrode (AE1, AE2), the light shielding layer (LS), the high power line (VDD), the low power line (VSS), the data line (DL1, DL2, DL3), the first reference line (Ref1), the buffer layer 210, the insulating interlayer 220, the passivation layer 230, and the planarization layer 240 are the same as those of FIG. 9, whereby a detailed description for the above elements will be omitted.

The first connection electrode (CE1) and the second source electrode (S2) are formed in each of first to third circuit device columns (C1, C2, C3). The first connection electrode (CE1) is formed between the buffer layer 210 and the insulating interlayer 220, and the second source electrode (S2) is formed between the insulating interlayer 220 and the passivation layer 230. Thus, the first connection electrode (CE1) is provided at a predetermined interval from the light shielding layer (LS) under the circumstances that the buffer layer 210 is provided in-between, and is also provided at a predetermined interval from the second source electrode (S2) under the circumstances that the insulating interlayer 220 is provided in-between. The first connection electrode (CE1), the light shielding layer (LS), and the second source electrode (S2) are overlapped with one another, to thereby form a capacitance. The first connection electrode (CE1) is provided in the same layer as the active layer (A1, A2, A3). The active layer (A1, A2, A3) may be formed of oxide semiconductor, and the first connection electrode (CE1) may be formed of a conductive material obtained by carrying out a conducting process for applying heat to the oxide semiconductor.

The first electrode 310, 320 and 330 is formed on the planarization layer 240. The first electrode 310 overlapped with the third circuit device column (C3) is connected with the second source electrode (S2) of the third circuit device column (C3) via a first contact hole (CH1) provided in the passivation layer 230 and the planarization layer 240. The first electrode 320 overlapped with the second circuit device column (C2) is connected with the second source electrode (S2) of the second circuit device column (C2) via a second contact hole (CH2) provided in the passivation layer 230 and the planarization layer 240. The first electrode 330 overlapped with the first circuit device column (C1) is connected with the second source electrode (S2) of the first circuit device column (C1) via a third contact hole (CH3) provided in the passivation layer 230 and the planarization layer 240.

The bank 400 is formed on the first electrodes 310, 320 and 330. Also, the bank 400 is formed on the planarization layer 240 between each of the first electrodes 310, 320 and 330.

The second electrode 600 is formed on the bank 400.

Figure 11:
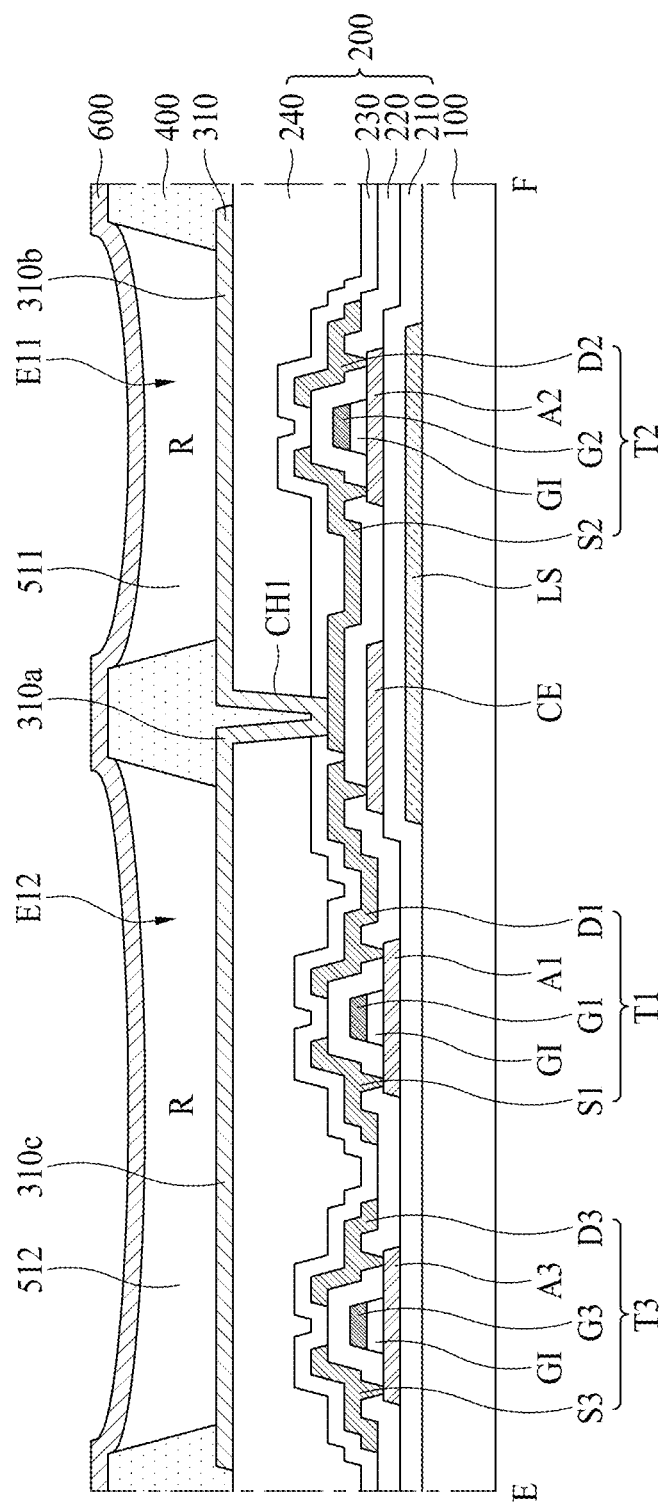
FIG. 11 is a cross sectional view along E-F of FIG. 8.

FIG. 11 is a cross sectional view along E-F of FIG. 8. That is, FIG. 11 corresponds to a cross section of a line which traverses a sensing thin film transistor (T3), a switching thin film transistor (T1), a first contact hole (CH1), and a driving thin film transistor (T2) in a third circuit device column (C3).

As shown in FIG. 11, a circuit device layer 200, a first electrode 310, a bank 400, a first emission layer 511 and 512, and a second electrode 600 are formed on a substrate 100.

The circuit device layer 200 includes a light shielding layer (LS), a sensing thin film transistor (T3), a switching thin film transistor (T1), a first connection electrode (CE1, CE), a driving thin film transistor (T2), a buffer layer 210, an insulating interlayer 220, a passivation layer 230, and a planarization layer 240.

The light shielding layer (LS) is formed on the substrate 100. The light shielding layer (LS) is overlapped with the first connection electrode (CE1, CE) and the driving thin film transistor (T2).

The sensing thin film transistor (T3) includes a third active layer (A3) provided on the buffer layer 210, a gate insulating film (GI) provided on the third active layer (A3), a third gate electrode (G3) provided on the gate insulating film (GI), and third source and drain electrodes (S3, D3) provided on the insulating interlayer 220 and respectively connected with the third active layer (A3) via contact holes provided in the insulating interlayer 220.

The switching thin film transistor (T1) includes a first active layer (A1) provided on the buffer layer 210, a gate insulating film (GI) provided on the first active layer (A1), a first gate electrode (G1) provided on the gate insulating film (GI), and first source and drain electrodes (S1, D1) provided on the insulating interlayer 220 and respectively connected with the first active layer (A1) via contact holes provided in the insulating interlayer 220.

The first connection electrode (CE1, CE) is formed on the buffer layer 210. The first connection electrode (CE1, CE) is connected with the first drain electrode (D1) via a contact hole provided in the insulating interlayer 220.

The driving thin film transistor (T2) includes a second active layer (A2) provided on the buffer layer 210, a gate insulating film (GI) provided on the second active layer (A2), a second gate electrode (G2) provided on the gate insulating film (GI), and second source and drain electrodes (S2, D2) provided on the insulating interlayer 220 and respectively connected with the second active layer (A2) via contact holes provided in the insulating interlayer 220. The second source electrode (S2) extends on the insulating interlayer 220 so as to be overlapped with the first connection electrode (CE1, CE).

The passivation layer 230 is formed on the sensing thin film transistor (T3), the switching thin film transistor (T1), and the driving thin film transistor (T2), and the planarization layer 240 is formed on the passivation layer 230.

The first electrode 310 is formed on the planarization layer 240. The first electrode 310 is connected with the second source electrode (S2) of the driving thin film transistor (T2) via a first contact hole (CH1) provided in the passivation layer 230 and the planarization layer 240. With respect to the first contact hole (CH1), the sensing thin film transistor (T3) and the switching thin film transistor (T1) are formed at one side area of the first contact hole (CH1), and the driving thin film transistor (T2) is formed at the other side area of the first contact hole (CH1).

The bank 400 is formed on the first electrode 310. The bank 400 covers both ends of the first electrode 310, and also covers an overlap portion 310a of the first electrode 310 which is overlapped with the first contact hole (CH1). Accordingly, a first sub emission area (E11) and a second sub emission area (E12) are defined by the bank 400. Herein, one side portion 310b of the first electrode 310, which is not covered by the bank 400, is exposed to the first sub emission area (E11), and the other side portion 310c of the first electrode 310, which is not covered by the bank 400, is exposed to the second sub emission area (E12).

Also, one side portion 310b of the first electrode 310 is overlapped with the driving thin film transistor (T2), and the other side portion 310c of the first electrode 310 may be overlapped with the sensing thin film transistor (T3) and the switching thin film transistor (T1).

A first sub emission layer 511 of a red (R) emitting layer is formed in the first sub emission area (E11) defined by the bank 400, and a second sub emission layer 512 of a red (R) emitting layer is formed in the second sub emission area (E12) defined by the bank 400. The first sub emission layer 511 is overlapped with the driving thin film transistor (T2), and the second sub emission layer 512 may be overlapped with the sensing thin film transistor (T3) and the switching thin film transistor (T1).

The second electrode 600 is formed on the bank 400 and the first emission layer 511 and 512.

Figure 12:
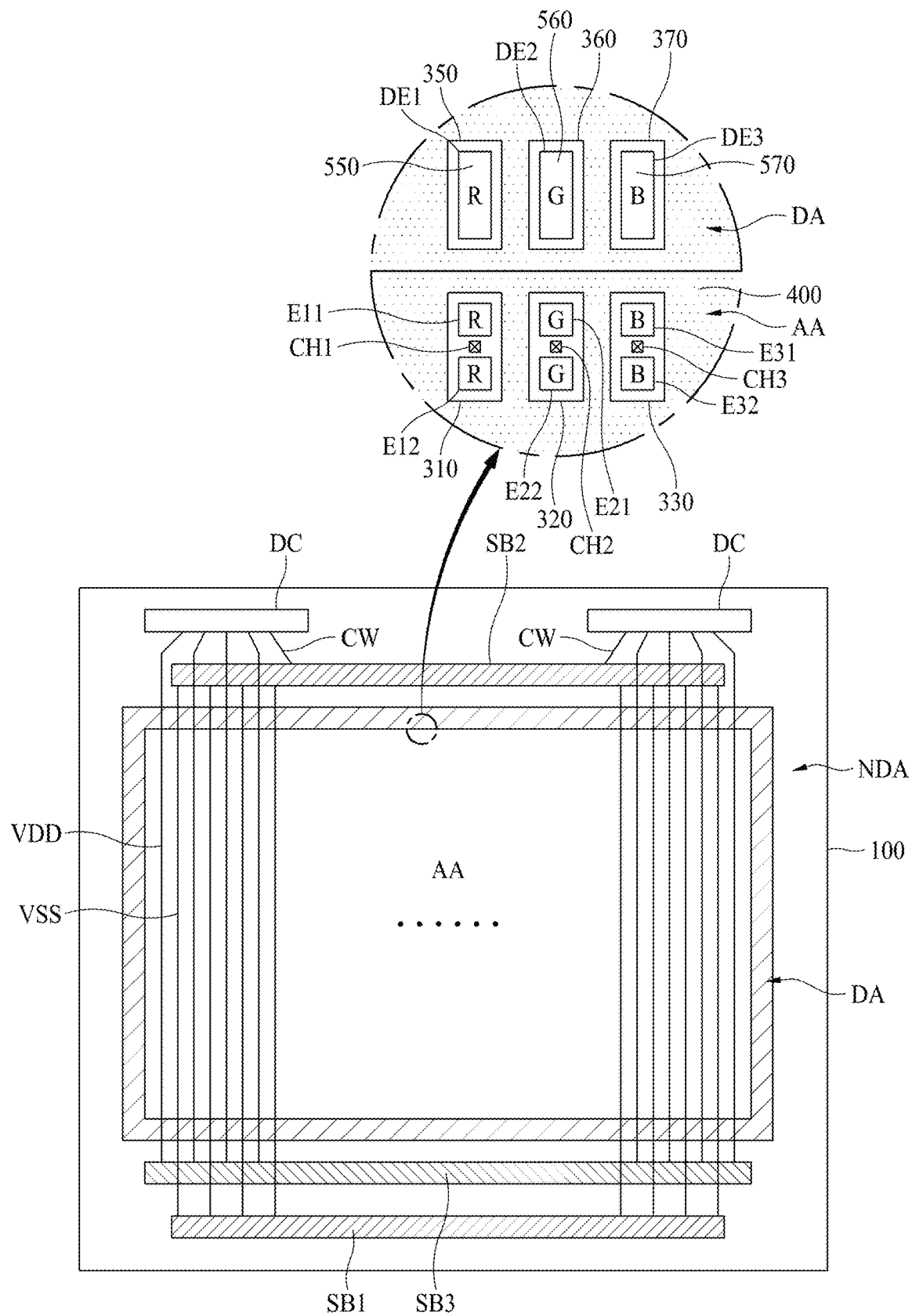
FIG. 12 is a plane view illustrating an electroluminescent display device according to another embodiment of the present disclosure.

FIG. 12 a plane view illustrating an electroluminescent display device having an active area and a non-display area according to another embodiment of the present disclosure.

As shown in FIG. 12, the active area (AA) is prepared in the center of a substrate 100, and the non-display area (NDA) is prepared in the periphery of the active area (AA). The active area (AA) corresponds to the area for displaying an image by the use of light emission, and the non-display area (NDA) corresponds to the area in which a light emission is not generated, and thus, an image is not displayed.

A pixel structure according to the aforementioned various embodiments of the present disclosure is formed in the active area (AA). That is, as shown in an expanded view marked by an arrow, the active area (AA) is provided with a first electrode 310, 320 and 330, a bank 400 for defining an emission area (E11, E12, E21, E22, E31, E32) so as not to be overlapped with a contact hole (CH1, CH2, CH3), a first emission layer 511 and 512 provided in the first emission area (E11, E12), a second emission layer 521 and 522 provided in the second emission area (E21, E22), and a third emission layer 531 and 532 provided in the third emission area (E31, E32).

The non-display area (NDA) includes a dummy area (DA). The dummy area (DA) is formed in the periphery of the active area (AA). In the dummy area (DA), a plurality of dummy emission areas (DE1, DE2, DE3) are defined by the bank 400, and a plurality of dummy emission layers 550, 560 and 570 are respectively formed in the plurality of dummy emission areas (DE1, DE2, DE3). That is, the first dummy emission layer 550 is formed in the first dummy emission area (DE1), the second dummy emission layer 560 is formed in the second dummy emission area (DE2), and the third dummy emission layer 570 is formed in the third dummy emission area (DE3). The first dummy emission layer 550 is formed of a red (R) emitting layer, the second dummy emission layer 560 is formed of a green (G) emitting layer, and the third dummy emission layer 570 is formed of a blue (B) emitting layer. Also, the plurality of dummy emission areas (DE1, DE2, DE3) may be overlapped with individually patterned dummy electrodes 350, 360 and 370. The dummy electrodes 350, 360 and 370 are formed on the aforementioned planarization layer 240, and more particularly, formed below the respective dummy emission layers 550, 560 and 570.

A light emission is not generated in the dummy emission layer 550, 560 and 570. Thus, even though there is a step difference in a surface of the dummy electrode 350, 360 and 370 exposed in the dummy emission area (DE1, DE2, DE3), it is negligible. If needed, it is possible that the dummy electrode 350, 360 and 370 is not connected with a terminal of a driving thin film transistor. Thus, each dummy emission layer 550, 560 and 570 does not correspond to a combination of sub dummy emission layers spaced from each other with a contact hole interposed in-between.

The first dummy emission layer 550 has a relatively large sized area in comparison to an area of the first emission layer 511 and 512, that is, an area obtained by adding an area of the first sub emission layer 511 and an area of the second sub emission layer 512. The second dummy emission layer 560 has a relatively large sized area in comparison to an area of the second emission layer 521 and 522, and the third dummy emission layer 570 has a relatively large sized area in comparison to an area of the third emission layer 531 and 532. In the same manner, the first dummy emission area (DE1) has a relatively large sized area in comparison to an area of the first emission area (E11, E12), that is, an area obtained by adding an area of the first sub emission area (E11) and an area of the second sub emission area (E12). The second dummy emission area (DE2) has a relatively large sized area in comparison to an area of the second emission area (E21, E22), and the third dummy emission area (DE3) has a relatively large sized area in comparison to an area of the third emission area (E31, E32).

The dummy emission layer 550, 560 and 570 is provided to obtain uniformity between a profile of the emission layer 511, 512, 521, 522, 531 and 532 in the center of the active area (AA) and a profile of the emission layer 511, 512, 521, 522, 531 and 532 in the edge of the active area (AA).

If the emission layer 511, 512, 521, 522, 531 and 532 is formed by a solution process, a drying speed of the emission layer 511, 512, 521, 522, 531 and 532 in the center of the active area (AA) may be different from a drying speed of the emission layer 511, 512, 521, 522, 531 and 532 at the edge of the active area (AA), whereby a profile of the emission layer 511, 512, 521, 522, 531 and 532 in the center of the active area (AA) and a profile of the emission layer 511, 512, 521, 522, 531 and 532 at the edge of the active area (AA) may be not uniform. Thus, it is difficult to realize uniformity of light emission in the active area (AA). For this reason, the dummy area (DA) is formed in the non-display area (NDA), and the dummy emission layer 550, 560 and 570 is also formed in the non-display area (NDA) when the emission layer is formed in the active area (AA) by the solution process. That is, even though the profile is not uniform in the dummy emission layer 550, 560 and 570 and the emission layer 511, 512, 521, 522, 531 and 532, it is possible to realize the uniform profile of the emission layer 511, 512, 521, 522, 531 and 532 in the entire active area (AA).

A plurality of high power lines (VDD) and a plurality of low power lines (VSS) are alternately arranged in a first direction, for example, a vertical direction in the active area (AA). The plurality of high power lines (VDD) and the plurality of low power lines (VSS) extend to the non-display area (NDA).

Respective lower ends of the plurality of low power lines (VSS) may be connected with each other by the use of first shorting bar (SB1), and respective upper ends of the plurality of low power lines (VSS) may be connected with each other by the use of second shorting bar (SB2), whereby the plurality of low power lines (VSS) may be electrically connected with each other. Each of the first shorting bar (SB1) and the second shorting bar (SB2) is formed in the non-display area (NDA). The first shorting bar (SB1) and the second shorting bar (SB2) may be positioned in the same layer as the aforementioned first electrode 310, 320 and 330, and may be formed of the same material as that of the aforementioned first electrode 310, 320 and 330. The second shorting bar (SB2) may be connected with a driving circuit portion (DC) provided in the non-display area (NDA) via a contact wire (CW). Thus, low power applied through the driving circuit portion (DC) may be transmitted to the plurality of low power lines (VSS) via the contact wire (CW) and the second shorting bar (SB2).

Respective lower ends of the plurality of high power lines (VDD) may be connected with each other by the use of third shorting bar (SB3). Thus, the plurality of high power lines (VDD) may be electrically connected with each other. Also, respective upper ends of the plurality of high power lines (VDD) may be connected with the driving circuit portion (DC). Thus, high power may be applied to the plurality of high power lines (VDD) via the driving circuit portion (DC).

According to the aforementioned various embodiments of the present disclosure, the bank 400 is overlapped with the contact hole (CH1, CH2, CH3) area for connecting the first electrode 310, 320 and 330 with the second source electrode (S2) of the driving thin film transistor (T2) so that it is possible to decrease the step difference in the surface of the first electrode 310, 320 and 330 exposed to the emission area (E11, E12, E21, E22, E31, E32) defined by the bank 400, but the arrangement is not limited to these structures. If the step difference is generated in the surface of the first electrode 310, 320 and 330 by another contact hole provided in the circuit device layer 200, the bank 400 is overlapped with another contact hole area so that it is possible to decrease the step difference in the surface of the first electrode 310, 320 and 330 exposed to the emission area (E11, E12, E21, E22, E31, E32) defined by the bank 400.

According to one embodiment of the present disclosure, the first and second sub emission areas included in one emission area are spaced from each other under the circumstance that the contact hole is disposed in-between, whereby an emission area is not overlapped with the contact hole. Accordingly, the step difference caused by the contact hole is not generated in an emission area so that it is possible to realize the desired profile in the emission layer of the emission area, thereby realizing the uniform light emission in the emission area.

It will be apparent to those skilled in the art that the present disclosure described above is not limited by the above-described embodiments and the accompanying drawings and that various substitutions, modifications, and variations can be made in the present disclosure without departing from the scope of the disclosure. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. Aspects of the embodiments can be modified, if necessary, to provide yet further embodiments.

It will be apparent to those skilled in the art that various modifications and variations can be made in the electroluminescence display device of the present disclosure without departing from the technical idea or scope of the disclosure. Thus, it is intended that the present disclosure cover the modifications and variations of this disclosure provided they come within the scope of the appended claims and their equivalents.

The following clauses are also disclosed:

1. An electroluminescent display device comprising:
a substrate;
a circuit device layer provided on the substrate and configured to include a contact hole;
a first electrode provided on the circuit device layer;
a bank provided on the first electrode and configured to define a first sub emission area for exposing a first portion of the first electrode, and a second sub emission area for exposing a second portion of the first electrode;
a first sub emission layer provided in the first sub emission area; and
a second sub emission layer provided in the second sub emission area, wherein an area between the first sub emission area and the second sub emission area is overlapped with the contact hole of the circuit device layer.

2. The electroluminescent display device according to clause 1, wherein the circuit device layer further includes an electrode of a thin film transistor exposed via the contact hole, and the first electrode is connected with the electrode of the thin film transistor via the contact hole.

3. The electroluminescent display device according to clause 1 or clause 2, wherein the first electrode is provided with a groove positioned in an overlap area which is overlapped with the contact hole of the circuit device layer, and the bank is filled in the groove.

4. The electroluminescent display device according to any preceding clause, wherein the first sub emission layer and the second sub emission layer emit the same colored light at the same time.

5. The electroluminescent display device according to any preceding clause, wherein the first sub emission area and the second sub emission area are spaced from each other.

6. The electroluminescent display device according to any preceding clause, wherein an area of the first sub emission area is identical to an area of the second sub emission area.

7. An electroluminescent display device comprising:
a substrate;
a high power line and a low power line arranged in a first direction on the substrate; a plurality of circuit device columns provided between the high power line and the low power line on the substrate, and configured to include a plurality of thin film transistors and contact holes;
a bank provided on the high power line, the low power line, and the plurality of circuit device columns, and configured to define a plurality of emission areas; and
an emission layer provided in each of the plurality of emission areas,
wherein the plurality of emission areas includes a first emission area which is overlapped with the high power line and any one circuit device column among the plurality of circuit device columns or overlapped with the low power line and any one circuit device column among the plurality of circuit device columns, and is configured to emit first color light,
wherein the first emission area includes first and second sub emission areas spaced from each other with respect to a first contact hole provided in the any one circuit device column.

8. The electroluminescent display device according to clause 7,
wherein the plurality of emission areas additionally include a second emission area which is overlapped with another circuit device column among the plurality of circuit device columns and is configured to emit second color light, and a third emission area which is overlapped with still another circuit device column among the plurality of circuit device columns and is configured to emit third color light,
wherein the second emission area includes first and second sub emission areas spaced from each other with respect to a second contact hole provided in the another circuit device column, and
the third emission area includes first and second sub emission areas spaced from each other with respect to a third contact hole provided in the still another circuit device column.

9. The electroluminescent display device according to clause 8, wherein an area of the first emission area is relatively larger than each of an area of the second emission area and an area of the third emission area.

10. The electroluminescent display device according to clause 8 or clause 9, wherein the first contact hole, the second contact hole, and the third contact hole are positioned on one straight line.

11. The electroluminescent display device according to any of clauses 7-10, further comprising a first electrode overlapped with the first emission area and configured to have a relatively large area in comparison to the first emission area,
wherein the first electrode is connected with an electrode of a driving thin film transistor provided in the any one circuit device column via the contact hole.

12. The electroluminescent display device according to clause 11, wherein the first electrode is provided with a groove in an area overlapped with the contact hole area, and the bank is filled in the groove.

13. The electroluminescent display device according to any of clauses 7-12, further comprising a reference line and first to third data lines between each of the plurality of circuit device columns on the substrate,
wherein the plurality of circuit device columns include a first circuit device column provided between the high power line and the first data line, a second circuit device column provided between the second data line and the reference line, and a third circuit device column provided between the reference line and the third data line.

14. The electroluminescent display device according to clause 13, further comprising a first connection line extending from the high power line to the first circuit device column, the second circuit device column, the third circuit device column, and the low power line, wherein the first connection line connects the high power line with each terminal of driving thin film transistors provided in the first to third circuit device columns.

15. The electroluminescent display device according to clause 13 or clause 14, further comprising a second connection line extending from the reference line to the first circuit device column, the second circuit device column, and the third circuit device column, wherein the second connection line connects the reference line with each terminal of sensing thin film transistors provided in the first to third circuit device columns.

16. An electroluminescent display device comprising:
a substrate including an active area and a dummy area provided in the periphery of the active area;
a bank configured to define an emission area on the active area of the substrate, and a dummy emission area on the dummy area of the substrate; and
an emission layer provided in the emission area, and a dummy emission layer provided in the dummy emission area,
wherein the emission area includes first and second sub emission areas spaced from each other by the bank, and
an area of the dummy emission area is larger than an area obtained by adding an area of the first sub emission area and an area of the second sub emission area.

17. The electroluminescent display device according to clause 16, further comprising a circuit device layer provided with a contact hole between the substrate and the bank,
wherein an area between the first sub emission area and the second sub emission area is overlapped with the contact hole of the circuit device layer.

18. The electroluminescent display device according to clause 17, further comprising a first electrode provided on the circuit device layer, wherein the first electrode is connected with an electrode of a thin film transistor provided in the circuit device layer via the contact hole.

19. The electroluminescent display device according to clause 18, wherein the first electrode is provided with a groove in an area overlapped with the contact hole area, and the bank is filled in the groove.

20. The electroluminescent display device according to any of clauses 16-19, wherein the first sub emission layer and the second sub emission layer emit same colored light at the same time.

A1. An electroluminescent display device comprising:
a substrate;
a high power line and a low power line arranged in a first direction on the substrate; a plurality of circuit device columns provided between the high power line and the low power line on the substrate, and including a plurality of thin film transistors and contact holes;
a bank provided on the high power line, the low power line, and the plurality of circuit device columns, and defining a plurality of emission areas; and
an emission layer provided in each of the plurality of emission areas,
wherein the plurality of emission areas includes a first emission area which is overlapped with the high power line and any one circuit device column among the plurality of circuit device columns or which is overlapped with the low power line and the any one circuit device column among the plurality of circuit device columns, and is configured to emit light of a first color,
wherein the first emission area includes first and second sub emission areas spaced apart from each other either side of a first contact hole provided in the any one circuit device column.

A2. The electroluminescent display device according to clause A1,
wherein the bank additionally defines a second emission area which is overlapped with another circuit device column of the plurality of circuit device columns and is configured to emit light of a second color, and a third emission area which is overlapped with still another circuit device column of the plurality of circuit device columns and is configured to emit light of a third color,
wherein the second emission area includes first and second sub emission areas spaced apart from each other either side of a second contact hole provided in the another circuit device column, and
the third emission area includes first and second sub emission areas spaced apart from each other either side of a third contact hole provided in the still another circuit device column.

A3. The electroluminescent display device according to clause A2, wherein an area of the first emission area is larger than each of an area of the second emission area and an area of the third emission area.

A4. The electroluminescent display device according to any of clauses A1-A3, wherein the first contact hole, the second contact hole, and the third contact hole are positioned on one straight line.

A5. The electroluminescent display device according to any of clauses A1-A4, further comprising a first electrode overlapped with the first emission area and having an area larger than the first emission area,
wherein the first electrode is connected with an electrode of a driving thin film transistor provided in the any one circuit device column via the contact hole.

A6. The electroluminescent display device according to any of clauses A1-A5, wherein the first electrode is provided with a groove in an area overlapped with the contact hole area, and the bank is filled in the groove.

A7. The electroluminescent display device according to any of clauses A1-A6, further comprising a reference line and first to third data lines between respective ones of the plurality of circuit device columns on the substrate,
wherein the plurality of circuit device columns includes a first circuit device column provided between the high power line and the first data line, a second circuit device column provided between the second data line and the reference line, and a third circuit device column provided between the reference line and the third data line.

A8. The electroluminescent display device according to clause A7, further comprising a first connection line extending from the high power line to the first circuit device column, the second circuit device column, the third circuit device column, and the low power line, wherein the first connection line connects the high power line with each terminal of driving thin film transistors provided in the first to third circuit device columns.

A9. The electroluminescent display device according to clause A7 or clause A8, further comprising a second connection line extending from the reference line to the first circuit device column, the second circuit device column, and the third circuit device column, wherein the second connection line connects the reference line with each terminal of sensing thin film transistors provided in the first to third circuit device columns.

B1. An electroluminescent display device comprising:
a substrate including an active area and a dummy area provided in the periphery of the active area;
a bank defining an emission area on the active area of the substrate, and a dummy emission area on the dummy area of the substrate; and
an emission layer provided in the emission area, and a dummy emission layer provided in the dummy emission area,
wherein the emission area includes first and second sub emission areas spaced apart from each other by the bank, and
wherein an area of the dummy emission area is larger than an area obtained by adding an area of the first sub emission area and an area of the second sub emission area.

B2. The electroluminescent display device according to clause B1, further comprising a circuit device layer provided with a contact hole between the substrate and the bank,
wherein an area between the first sub emission area and the second sub emission area is overlapped with the contact hole of the circuit device layer.

B3. The electroluminescent display device according to clause B1 or clause B2, further comprising a first electrode provided on the circuit device layer,
wherein the first electrode is connected with an electrode of a thin film transistor, provided in the circuit device layer, via the contact hole.

B4. The electroluminescent display device according to clause B3, wherein the first electrode is provided with a groove in an area overlapped with the contact hole, and the bank extends into and fills the groove.

B5. The electroluminescent display device according to any of clauses B1-B4, wherein the first sub emission layer and the second sub emission layer are configured to emit light of the same color at the same time.

What is claimed is:

1. An electroluminescent display device comprising:
a substrate;
a circuit device layer provided on the substrate and including a first contact hole;
a first electrode provided on the circuit device layer;
a bank provided on the first electrode and defining a first emission area comprising a first sub emission area for exposing a first portion of the first electrode, and a second sub emission area for exposing a second portion of the first electrode;
a first sub emission layer provided in the first sub emission area;
a second sub emission layer provided in the second sub emission area, and
at least one data line extending in a first direction, the at least one data line being disposed between the first emission area and a third emission area, wherein a portion of the bank extends between the first emission area and the third emission area in the first direction, the portion of the bank overlapping the at least one data line,
wherein an overlap area between the first sub emission area and the second sub emission area is overlapped with the first contact hole of the circuit device layer.

2. The electroluminescent display device according to claim 1, wherein the circuit device layer further includes an electrode of a thin film transistor exposed via the first contact hole, and wherein the first electrode is connected to the electrode of the thin film transistor via the first contact hole.

3. The electroluminescent display device according to claim 1, wherein the first electrode is provided with a groove positioned in the overlap area which is overlapped with the first contact hole of the circuit device layer, and wherein the bank extends into the groove.

4. The electroluminescent display device according to claim 1, wherein the first sub emission layer and the second sub emission layer are configured to emit light of the same color at the same time.

5. The electroluminescent display device according to claim 1, wherein the first sub emission area and the second sub emission area are spaced apart from each other.

6. The electroluminescent display device according to claim 1, wherein the bank comprises a first bank and a second bank.

7. The electroluminescent display device according to claim 6, wherein the first bank is hydrophilic and wherein the second bank is hydrophobic.

8. The electroluminescent display device according to claim 6, further comprising at least one data line extending in a first direction, the at least one data line being disposed between the first emission area and a third emission area, wherein a portion of the second bank extends between the first emission area and the third emission area in the first direction, the portion of the second bank overlapping the at least one data line.

9. The electroluminescent display device according to claim 1, wherein an area of the first sub emission area is identical to an area of the second sub emission area.

10. The electroluminescent display device according to claim 1, wherein a first distance between the first electrode and a second electrode at a center of the first sub emission area is less than a second distance between the first electrode and the second electrode at a side of the first sub emission area.

11. An electroluminescent display device comprising:
a substrate;
a high power line and a low power line arranged in a first direction on the substrate;
a plurality of circuit device columns provided between the high power line and the low power line on the substrate, and including a plurality of thin film transistors and contact holes,
a bank provided on the high power line, the low power line, and the plurality of circuit device columns, and defining a plurality of emission areas; and
an emission layer provided in each of the plurality of emission areas,
wherein the plurality of emission areas includes a first emission area which is overlapped with the high power line and any one circuit device column among the plurality of circuit device columns or which is overlapped with the low power line and any one circuit device column among the plurality of circuit device columns, and is configured to emit light of a first color,
wherein the first emission area includes first and second sub emission areas spaced apart from each other either side of a first contact hole provided in the any one circuit device column,
wherein the bank additionally defines a second emission area which is overlapped with another circuit device column of the plurality of circuit device columns and which is configured to emit light of a second color, and a third emission area which is overlapped with still another circuit device column of the plurality of circuit device columns and which is configured to emit light of a third color,
wherein the second emission area includes first and second sub emission areas spaced apart from each other either side of a second contact hole provided in the another circuit device column, and
the third emission area includes first and second sub emission areas spaced apart from each other either side of a third contact hole provided in the still another circuit device column.

12. The electroluminescent display device according to claim 11, wherein an area of the first emission area is larger than each of an area of the second emission area and an area of the third emission area.

13. The electroluminescent display device according to claim 11, wherein the first contact hole, the second contact hole, and the third contact hole are positioned on one straight line.

14. The electroluminescent display device according to claim 11, further comprising a first electrode overlapped with the third emission area and having an area larger than the third emission area,
wherein the first electrode is connected with an electrode of a driving thin film transistor provided in the any one circuit device column via the third contact hole.

15. The electroluminescent display device according to claim 11, wherein a first electrode is provided with a groove in an area overlapped with the contact hole area, and the bank is filled in the groove.

16. The electroluminescent display device according to claim 11, comprising a reference line and first to third data lines between respective ones of the plurality of circuit device columns on the substrate,
wherein the plurality of circuit device columns includes a first circuit device column provided between the high power line and the first data line, a second circuit device column provided between the second data line and the reference line, and a third circuit device column provided between the reference line and the third data line.

17. The electroluminescent display device according to claim 16, further comprising a first connection line extending from the high power line to the first circuit device column, the second circuit device column, the third circuit device column, and the low power line, wherein the first connection line connects the high power line with each terminal of driving thin film transistors provided in the first to third circuit device columns.

18. The electroluminescent display device according to claim 16, further comprising a second connection line extending from the reference line to the first circuit device column, the second circuit device column, and the third circuit device column, wherein the second connection line connects the reference line with each terminal of sensing thin film transistors provided in the first to third circuit device columns.

19. The electroluminescent display device according to claim 11, wherein the plurality of thin film transistors are oxide thin film transistors.

20. An electroluminescent display device comprising:
a substrate;
a circuit device layer provided on the substrate and including a first contact hole;
a first electrode provided on the circuit device layer;
a bank provided on the first electrode and defining a first emission area comprising a first sub emission area for exposing a first portion of the first electrode, and a second sub emission area for exposing a second portion of the first electrode;
a first sub emission layer provided in the first sub emission area; and
a second sub emission layer provided in the second sub emission area,
wherein an overlap area between the first sub emission area and the second sub emission area is overlapped with the first contact hole of the circuit device layer, and
the substrate includes an active area and a dummy area provided in the periphery of the active area;
the bank is configured to define an emission area, comprising the first emission area, a second emission area and a third emission area, on the active area of the substrate, and a dummy subarea on the dummy area of the substrate; and
an emission layer, comprising the first sub emission layer and the second sub emission layer, is provided in the emission area, and a dummy layer is provided in the dummy subarea,
wherein the first and second sub emission areas are spaced apart from each other by the bank, and
wherein an area of the dummy subarea is larger than an area obtained by adding the area of the first sub emission area and the area of the second sub emission area.

* * * * *